United States Patent
Lee et al.

(10) Patent No.: US 12,453,087 B2
(45) Date of Patent: Oct. 21, 2025

(54) SEMICONDUCTOR DEVICE HAVING STACKED SEMICONDUCTOR CHIPS INTERCONNECTED WITH SUPPORT STRUCTURES VIA TSV

(71) Applicant: SAMSUNG ELECTRONICS CO., LTD., Suwon-si (KR)

(72) Inventors: Seonho Lee, Cheonan-si (KR); Myungsung Kang, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 353 days.

(21) Appl. No.: 17/689,091

(22) Filed: Mar. 8, 2022

(65) Prior Publication Data
US 2023/0021376 A1    Jan. 26, 2023

(30) Foreign Application Priority Data

Jul. 22, 2021 (KR) .................. 10-2021-0096710

(51) Int. Cl.
| | |
|---|---|
| H01L 23/02 | (2006.01) |
| H01L 21/00 | (2006.01) |
| H01L 23/00 | (2006.01) |
| H01L 23/48 | (2006.01) |

(Continued)

(52) U.S. Cl.
CPC .................................. H10B 12/50 (2023.02)

(58) Field of Classification Search
CPC ............... H01L 23/481; H01L 23/3128; H01L 23/49816; H01L 23/5389; H01L 23/488; H01L 24/26; H01L 24/02; H01L 25/0657; H01L 2225/06513; H01L 2225/06517; H01L 2225/06541; H01L 2225/06568; H01L 2225/1058; H01L 25/10;
(Continued)

(56) References Cited

U.S. PATENT DOCUMENTS

| | | |
|---|---|---|
| 8,420,722 B2 | 4/2013 | Eom et al. |
| 8,710,654 B2 | 4/2014 | Tsukiyama et al. |
| 8,773,583 B2 | 7/2014 | Wakiyama et al. |

(Continued)

FOREIGN PATENT DOCUMENTS

| | | |
|---|---|---|
| JP | 2015-041743 A | 3/2015 |
| KR | 1020170140985 A | 12/2017 |

(Continued)

*Primary Examiner* — Ajay Ojha
*Assistant Examiner* — Tsz K Chiu
(74) *Attorney, Agent, or Firm* — Muir Patent Law, PLLC

(57) ABSTRACT

A semiconductor package including a first semiconductor chip; second semiconductor chips sequentially stacked on the first semiconductor chip; a front connection pad on a lower surface of each of the second semiconductor chips; a rear connection pad attached to an upper surface of each of the first semiconductor chip and the second semiconductor chips; a chip connection terminal between the front connection pad and the rear connection pad; and a support structure between the first semiconductor chip and one of the second semiconductor chips and between adjacent ones of the second semiconductor chips, the support structure being spaced apart from the front connection pad, the rear connection pad, and the chip connection terminal, having a vertical height greater than a vertical height of the chip connection terminal, and including a metal.

18 Claims, 29 Drawing Sheets

(51) Int. Cl.
*H01L 25/065* (2023.01)
*H10B 12/00* (2023.01)

(58) Field of Classification Search
CPC ... H01L 2224/03011; H01L 2225/1035; H01L 2225/1088; H10B 12/50
See application file for complete search history.

(56) References Cited

U.S. PATENT DOCUMENTS

| | | | |
|---|---|---|---|
| 9,941,252 B2 | 4/2018 | Lee | |
| 10,002,852 B1* | 6/2018 | Hu | H01L 21/6835 |
| 10,020,290 B2* | 7/2018 | Choe | H01L 23/481 |
| 10,043,780 B2* | 8/2018 | Choi | H01L 25/0657 |
| 10,157,851 B2* | 12/2018 | Kim | H01L 24/08 |
| 10,431,547 B2* | 10/2019 | Nam | H01L 25/0657 |
| 10,930,613 B2* | 2/2021 | Park | H01L 24/73 |
| 11,024,569 B2* | 6/2021 | Fang | H01L 23/49827 |
| 2004/0201088 A1* | 10/2004 | Kim | H01L 25/50 257/E21.705 |
| 2009/0085227 A1 | 4/2009 | Shiraishi et al. | |
| 2011/0095418 A1* | 4/2011 | Lim | H01L 24/14 257/737 |
| 2013/0234320 A1* | 9/2013 | Lu | H01L 25/50 257/737 |
| 2016/0013174 A1* | 1/2016 | Han | H01L 24/92 438/109 |
| 2016/0064357 A1* | 3/2016 | Choe | H01L 24/06 438/109 |
| 2017/0358558 A1* | 12/2017 | Lee | H01L 25/0657 |
| 2018/0337120 A1* | 11/2018 | Cho | H01L 23/3128 |

FOREIGN PATENT DOCUMENTS

| | | | |
|---|---|---|---|
| KR | 1020180112394 A | 10/2018 | |
| KR | 1020200024499 A | 3/2020 | |
| WO | WO-2007024022 A1 * | 3/2007 | ....... H01L 21/76898 |

\* cited by examiner

SEMICONDUCTOR DEVICE HAVING STACKED SEMICONDUCTOR CHIPS INTERCONNECTED WITH SUPPORT STRUCTURES VIA TSV

CROSS-REFERENCE TO RELATED APPLICATION

This application is based on and claims priority under 35 U.S.C. § 119 to Korean Patent Application No. 10-2021-0096710, filed on Jul. 22, 2021, in the Korean Intellectual Property Office, the disclosure of which is incorporated by reference herein in its entirety.

BACKGROUND

1. Field

Embodiments relate to a semiconductor package.

2. Description of the Related Art

With the rapid development in the electronics industry and demands of users, semiconductor packages used in electronic products may provide high performance and include various functions, and thus, a semiconductor package including a plurality of semiconductor chips has been considered.

SUMMARY

The embodiments may be realized by providing a semiconductor package including a first semiconductor chip; second semiconductor chips sequentially stacked on the first semiconductor chip; a front connection pad on a lower surface of each of the second semiconductor chips; a rear connection pad attached to an upper surface of each of the first semiconductor chip and the second semiconductor chips; a chip connection terminal between the front connection pad and the rear connection pad; and a support structure between the first semiconductor chip and one of the second semiconductor chips and between adjacent ones of the second semiconductor chips, the support structure being spaced apart from the front connection pad, the rear connection pad, and the chip connection terminal, having a vertical height greater than a vertical height of the chip connection terminal, and including a metal.

The embodiments may be realized by providing a semiconductor package including an interposer; a first semiconductor chip mounted on the interposer; second semiconductor chips sequentially stacked on the first semiconductor chip; a front connection pad on lower surfaces of each of the second semiconductor chips; a rear connection pad attached to upper surfaces of each of the first semiconductor chip and the second semiconductor chips; a chip connection terminal between the front connection pad and the rear connection pad; a support structure between the first semiconductor chip and one of the second semiconductor chips and between adjacent ones of the second semiconductor chips, the support structure including: a metal, a first support post attached to the lower surfaces of each of the second semiconductor chips, and a second support post attached to the upper surface of the first semiconductor chip or the upper surface of a corresponding one of the second semiconductor chips, the upper surface of the second semiconductor chip being opposite to the lower surface of the second semiconductor chip; an insulating adhesive layer between the first semiconductor chip and one of the second semiconductor chips and between adjacent ones of the second semiconductor chips, the insulating adhesive layer surrounding the chip connection terminal and the support structure, and having a thickness substantially equal to a thickness of the support structure; and a molding layer on the first semiconductor chip and surrounding the second semiconductor chips and the insulating adhesive layer.

The embodiments may be realized by providing a semiconductor package including a redistribution layer (RDL) interposer; a buffer chip including a first substrate, first through electrodes penetrating at least a portion of the first substrate, and a first wiring layer on an active surface of the first substrate and including first wiring patterns, first wiring vias, and a first inter-wiring insulating layer surrounding the first wiring patterns and the first wiring vias, the buffer chip being attached to the RDL interposer with the active surface of the first substrate facing the RDL interposer; memory cell chips, each of which includes a second substrate, second through electrodes penetrating at least a portion of the second substrate, and a second wiring layer on an active surface of the second substrate and including second wiring patterns, second wiring vias, and a second inter-wiring insulating layer surrounding the second wiring patterns and the second wiring vias, each memory chip being sequentially stacked on the buffer chip with the active surface of the second substrate facing the buffer chip; front connection pads attached to a lower surface of the second wiring layer; rear connection pads attached to an inactive surface of the first substrate and an inactive surface of the second substrate; chip connection terminals between the buffer chip and the memory chips, and between the front connection pads and the rear connection pads; support structures between the buffer chip and one of the memory cell chips and between adjacent ones of the memory cell chips, each support structure including a metal and including a first support post spaced apart from the front connection pads and contacting some of the second wiring patterns, and a second support post spaced apart from the rear connection pads and contacting some of the second through electrodes; insulating adhesive layers between the buffer chip and one of the memory cell chips and between adjacent ones of the memory cell chips and surrounding the chip connection terminals and the support structures, each insulating adhesive layer having a thickness substantially equal to a thickness of each of the support structures; and a molding layer on the buffer chip and surrounding the memory cell chips and the insulating adhesive layers.

BRIEF DESCRIPTION OF THE DRAWINGS

Features will be apparent to those of skill in the art by describing in detail exemplary embodiments with reference to the attached drawings in which.

DETAILED DESCRIPTION

Figure 11A:
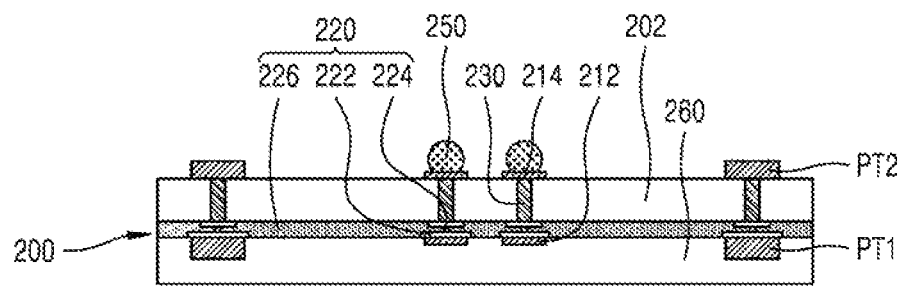
FIGS. 11A through 11O are cross-sectional views of stages in a method of manufacturing semiconductor packages, according to example embodiments.
Figure 11B:
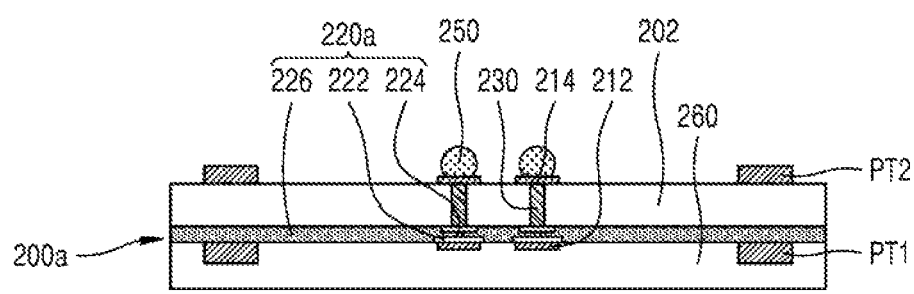
Figure 11C:
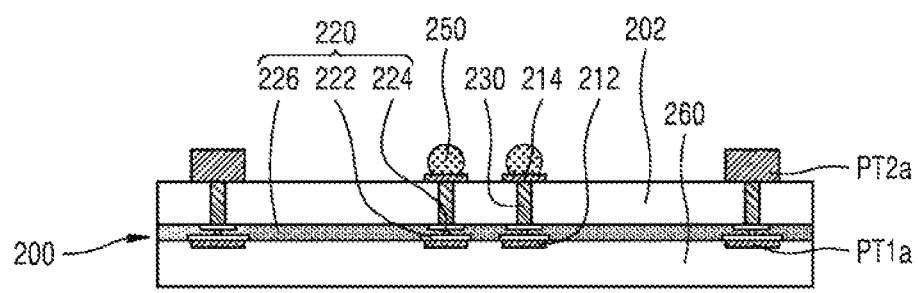
Figure 11D:
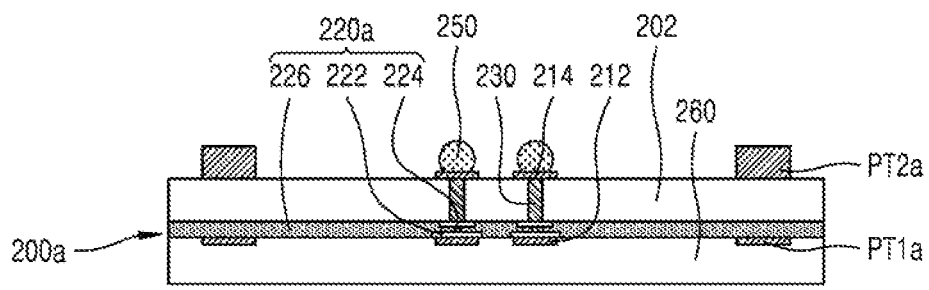
Figure 11E:
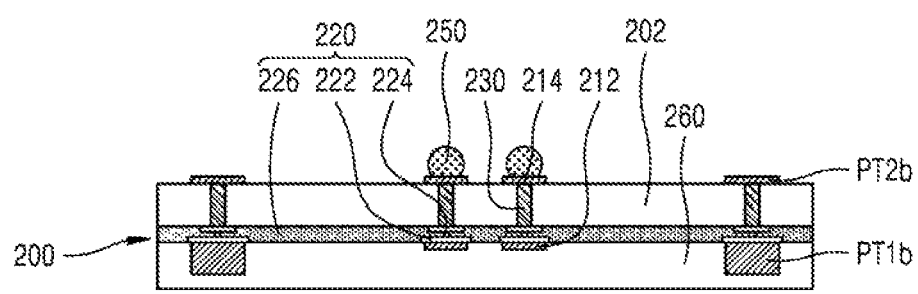
Figure 11F:
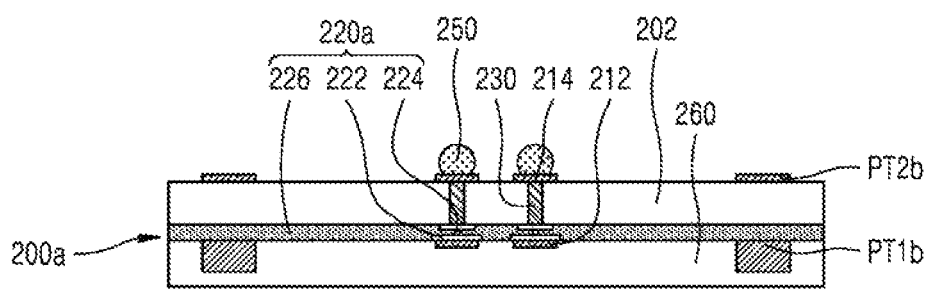
Figure 11G:
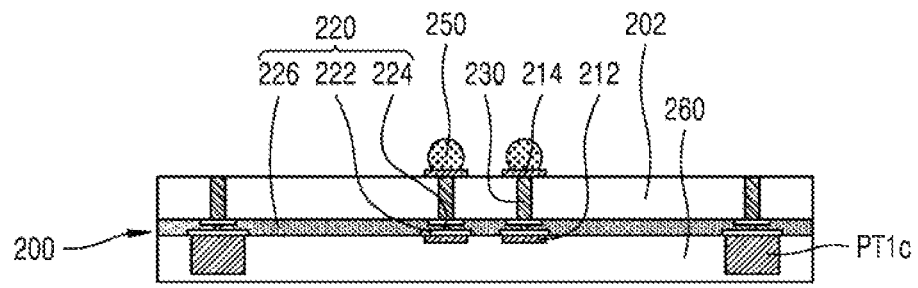
Figure 11H:
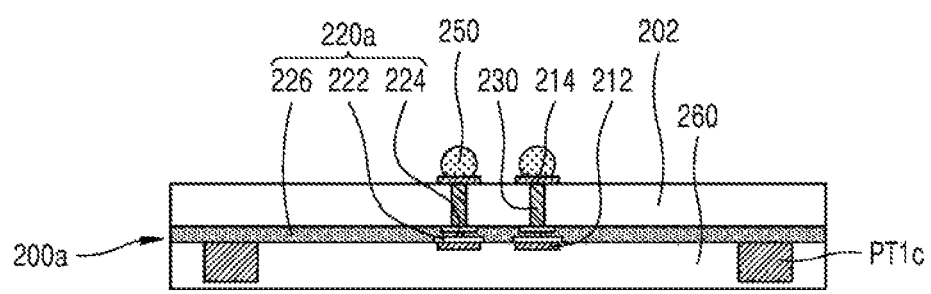
Figure 11I:
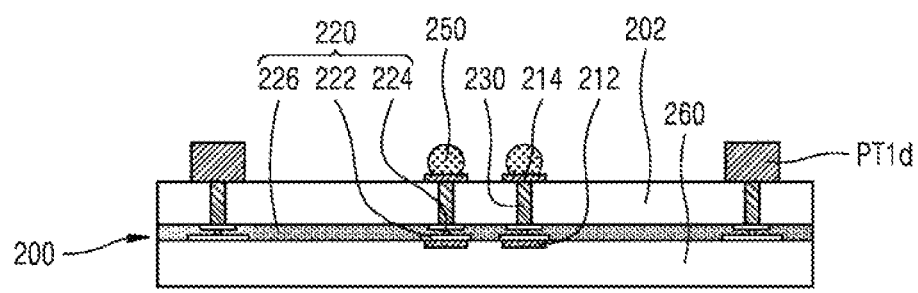
Figure 11J:
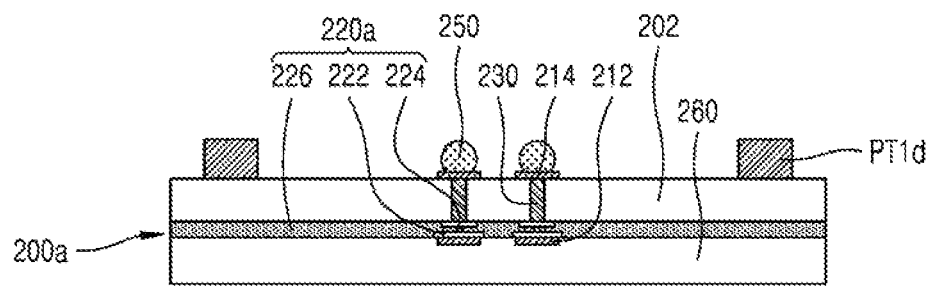
Figure 11K:
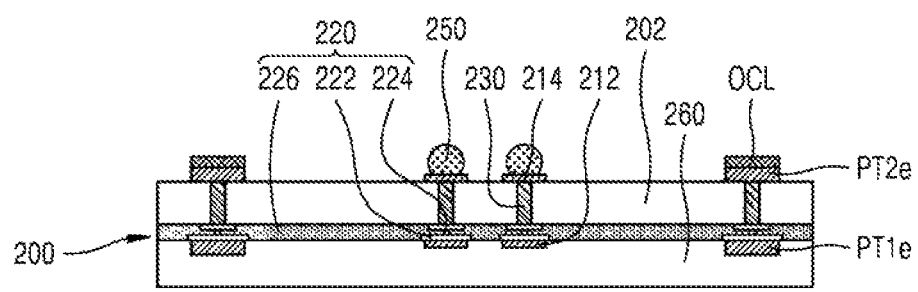
Figure 11L:
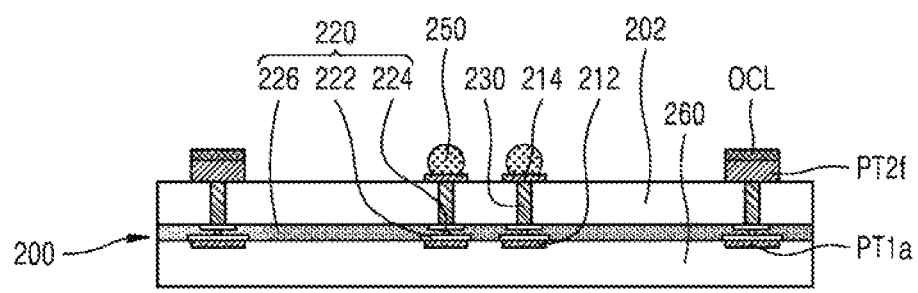
Figure 11M:
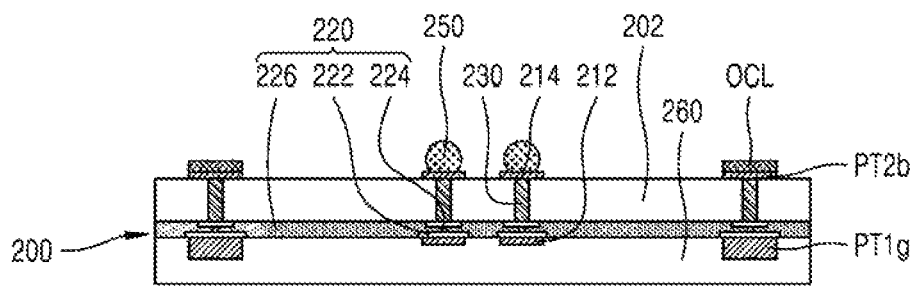
Figure 11N:
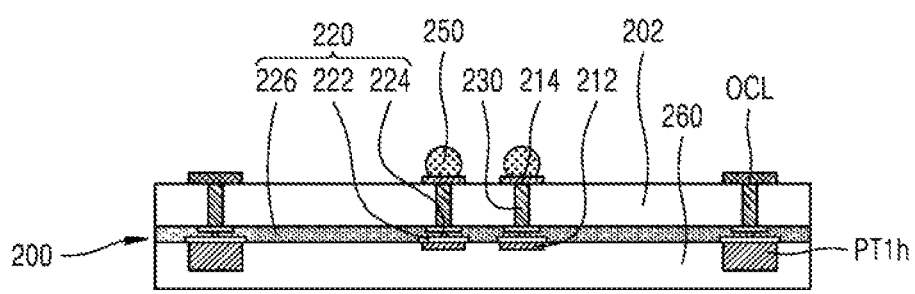
Figure 11O:
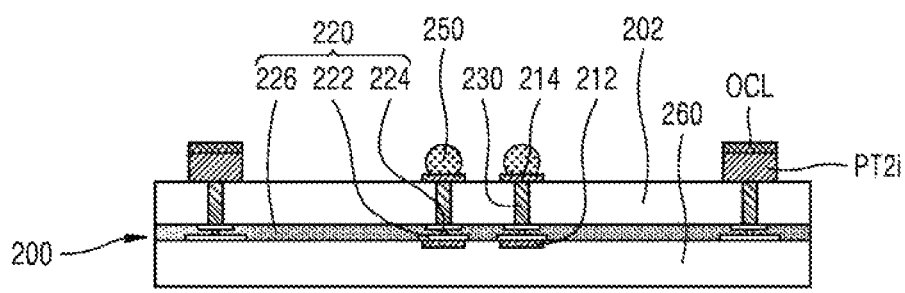

FIGS. 1A and 1B, 2A and 2B, 3A and 3B, 4A and 4B, 5A and 5B, 6A through 6E, 7A and 7B, and 8 are cross-sectional views of semiconductor packages according to example embodiments, and FIGS. 11A through 11O are cross-sectional views of stages in a method of manufacturing a semiconductor package, according to an example embodiment, and illustrate a second semiconductor chip to be included in the semiconductor package. In FIGS. 1A and 1B, 2A and 2B, 3A and 3B, 4A and 4B, 5A and 5B, 6A through 6E, 7A and 7B, 8, and 11A through 11O, the same reference numerals denote substantially the same elements, and descriptions already provided above with respect to the drawings may be omitted.

Figure 1A:
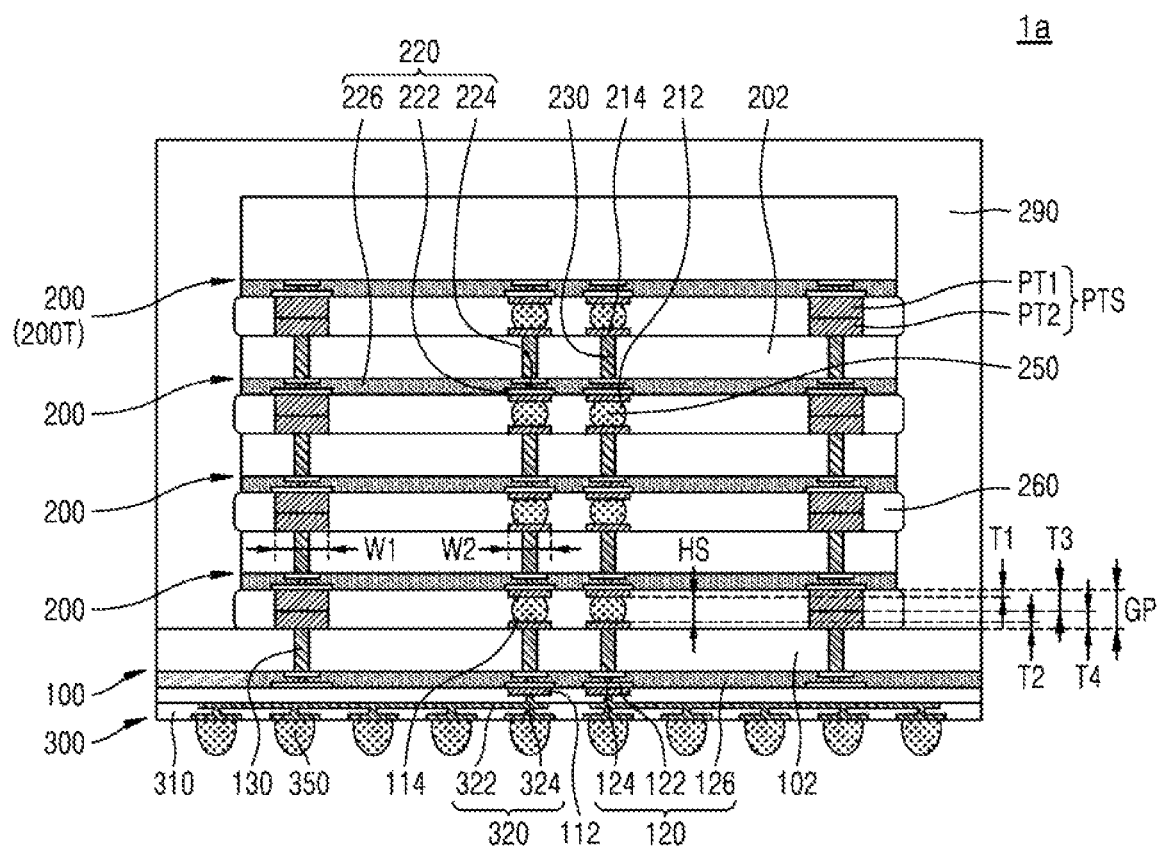
FIGS. 1A and 1B, 2A and 2B, 3A and 3B, 4A and 4B, 5A and 5B, 6A through 6E, 7A and 7B, and 8 are cross-sectional views of semiconductor packages according to example embodiments.

Referring to FIG. 1A, a semiconductor package 1a may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

In this specification, the description of an element being between a first semiconductor chip and a plurality of second semiconductor chips means the element is between each of the semiconductor chips including the first semiconductor chip and the plurality of second semiconductor chips. In other words, in the present specification, the description of an element being between the first semiconductor chip and the plurality of second semiconductor chips means the element is between the first semiconductor chip and a lowermost one of the plurality of second semiconductor chips, and between two adjacent second semiconductor chips among the plurality of second semiconductor chips.

In an implementation, as illustrated in FIG. 1A, the semiconductor package 1a may include, e.g., one first semiconductor chip 100 and four second semiconductor chips 200. In an implementation, the semiconductor package 1a may include two or more second semiconductor chips 200. In an implementation, the number of second semiconductor chips 200 in the semiconductor package 1a may be a multiple of 4. The plurality of second semiconductor chips 200 may be sequentially stacked on the first semiconductor chip 100 in a vertical direction. Each of the first semiconductor chip 100 and the plurality of second semiconductor chips 200 may be sequentially stacked with its active surface facing downward, i.e., toward the interposer 300.

In an implementation, the interposer 300 may be a redistribution layer (RDL) interposer. The interposer 300 may include at least one redistribution insulating layer 310 and a plurality of redistribution patterns 320. The plurality of redistribution patterns 320 may include a plurality of redistribution line patterns 322 and a plurality of redistribution vias 324. In an implementation, the interposer 300 may include a plurality of stacked redistribution insulating layers 310 therein. The redistribution insulating layer 310 may be formed of, e.g., a photo imageable dielectric (PID) or photosensitive polyimide (PSPI). In an implementation, each of the plurality of redistribution patterns 320 including the redistribution line pattern 322 and the redistribution via 324 may include, e.g., a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or the like, or an alloy thereof. In an implementation, the plurality of redistribution patterns 320 may be formed by stacking a metal or an alloy of a metal on a seed layer including Ti, titanium nitride (TiN), or titanium-tungsten (TiW). As used herein, the term "or" is not an exclusive term, e.g., "A or B" would include A, B, or A and B.

The plurality of redistribution line patterns 322 may be on at least one of upper and lower surfaces of the redistribution insulating layer 310. The plurality of redistribution vias 324 may penetrate the at least one redistribution insulating layer 310 and contact some of the plurality of redistribution line patterns 322 to be connected thereto. In an implementation, at least some of the plurality of redistribution line patterns 322 may be integrally formed together with some of the plurality of redistribution vias 324. In an implementation, each of the plurality of redistribution line patterns 322 may be formed integrally with a corresponding one of the plurality of redistribution vias 324 that is in contact with the upper surface of the redistribution line pattern 322.

In an implementation, each of the plurality of redistribution vias 324 may have a tapered shape with a horizontal width decreasing from a lower side to an upper side thereof. In an implementation, a horizontal width of each of the plurality of redistribution vias 324 may increase away from the first semiconductor chip 100.

Some of the plurality of redistribution line patterns 322 on an upper surface of the interposer 300 may be referred to as redistribution upper pads, and others arranged on a lower surface of the interposer 300 may be referred to as redistribution lower pads. A plurality of first front connection pads 112 may be respectively connected to the redistribution upper pads, and package connection terminals 350 may be respectively attached to the redistribution lower pads. Each of the package connection terminals 350 may perform a function of an external connection terminal of the semiconductor package 1a. The package connection terminals 350 may connect the semiconductor package 1a to the outside. In an implementation, the package connection terminals 350 may be bumps, solder balls, or the like.

In an implementation, the interposer 300 may be a silicon (Si) interposer. When the interposer 300 is a Si interposer, the interposer 300 may further include a base layer including Si and an internal through electrode penetrating the base layer, and may include, instead of the redistribution lower pads, interposer lower pads on a lower surface of the base layer and to which the package connection terminals 350 are attached.

The first semiconductor chip 100 may include a first substrate 102, a first wiring layer 120, and a plurality of first through electrodes 130. The plurality of first front connection pads 112 may be attached to or at a lower surface of the first semiconductor chip 100, and a plurality of first rear connection pads 114 may be attached to or at an upper surface of the first semiconductor chip 100. Each of the plurality of second semiconductor chips 200 may include a second substrate 202, a second wiring layer 220, and a plurality of second through electrodes 230. A plurality of second front connection pads 212 may be attached to or at a lower surface of the second semiconductor chip 200, and a plurality of second rear connection pads 214 may be attached to or at an upper surface of the second semiconductor chip 200.

In this specification, a front surface and a rear surface respectively indicate surfaces located on an active surface side and an inactive surface side, and an upper surface and a lower surface respectively indicate surfaces located on upper and lower sides in the drawing.

Each of the first and second substrates 102 and 202 may include Si. In an implementation, each of the first and second substrates 102 and 202 may include a semiconductor element such as germanium (Ge) or a compound semiconductor such as silicon carbide (SiC), gallium arsenide (GaAs), indium arsenide (InAs), or indium phosphide (InP). Each of the first and second substrates 102 and 202 may have an active surface and an inactive surface opposite to the active surface. Each of the first and second substrates 102 and 202 may include a plurality of various types of individual devices on its active surface. The plurality of individual devices may include various microelectronic devices, e.g., metal-oxide-semiconductor field effect transistors (MOSFETs) such as a complementary metal-oxide-semiconductor (CMOS) transistor, etc., system large scale integration (LSI) devices, image sensors such as a CMOS image sensor (CIS), or the like, micro-electro-mechanical systems (MEMS), active devices, passive devices, or the like.

The first semiconductor chip 100 and each of the second semiconductor chips 200 may respectively include a first semiconductor device and a second semiconductor device, each constituted by the plurality of individual devices. The first semiconductor device may be on the active surface of the first substrate 102, and the second semiconductor device may be on the active surface of the second substrate 202.

The first semiconductor chip 100 and the plurality of second semiconductor chips 200 may be, e.g., dynamic random access memory (DRAM), static RAM (SRAM), flash memory, or electrically erasable and programmable read-only memory (EEPROM), phase-change RAM (PRAM), magnetic RAM (MRAM), or resistive RAM (RRAM).

In an implementation, the first semiconductor chip 100 may not include a memory cell. The first semiconductor devices included in the first semiconductor chip 100 may include test logic circuits such as a serial-parallel conversion circuit, a design for test (DFT) logic, a joint test action group (JTAG) circuit, or a memory built-in self-test (MBIST) circuit, or a signal interface circuit such as a physical layer (PHY) interface. The second semiconductor device included in each of the plurality of second semiconductor chips 200 may include a memory cell. In an implementation, the first semiconductor chip 100 may be a buffer chip for controlling the plurality of second semiconductor chips 200.

In an implementation, the first semiconductor chip 100 may be a buffer chip for controlling high bandwidth memory (HBM) DRAM, and the plurality of second semiconductor chips 200 may be a memory cell chip having cells of the HBM DRAM controlled by the first semiconductor chip 100. The first semiconductor chip 100 may be referred to as a buffer chip or a master chip, and the plurality of second semiconductor chips 200 may be referred to as a memory cell chip or a slave chip. The first semiconductor chip 100 and the plurality of second semiconductor chips 200 stacked on the first semiconductor chip 100 may be collectively referred to as an HBM DRAM device or HBM DRAM chip.

The first wiring layer 120 may be on the active surface of the first substrate 102. The plurality of first front connection pads 112 may be on the first wiring layer 120, and the plurality of first rear connection pads 114 may be on an inactive surface of the first substrate 102. In an implementation, the plurality of first rear connection pads 114 may be on the upper surface of the first semiconductor chip 100, and the plurality of first front connection pads 112 may be on the lower surface of the first semiconductor chip 100.

The first wiring layer 120 may include a plurality of first wiring patterns 122, a plurality of first wiring vias 124, and a first inter-wiring insulating layer 126. The plurality of first wiring vias 124 may be connected to upper and/or lower surfaces of the plurality of first wiring patterns 122. In an implementation, the plurality of first wiring patterns 122 may be spaced apart from each other at different vertical levels, and the plurality of first wiring vias 124 may connect the first wiring patterns 122 at different vertical levels. The plurality of first wiring patterns 122 and the plurality of first wiring vias 124 may be electrically connected to the plurality of first rear connection pads 114 through the plurality of first through electrodes 130. The first inter-wiring insulating layer 126 may surround the plurality of first wiring patterns 122 and the plurality of first wiring vias 124.

The plurality of first through electrodes 130 may vertically penetrate at least a portion of the first substrate 102 to electrically connect the plurality of first front connection pads 112 to the plurality of first rear connection pads 114. In an implementation, the plurality of first front connection pads 112 may be electrically connected to the plurality of first rear connection pads 114 through the plurality of first through electrodes 130, the plurality of first wiring patterns 122, and the plurality of first wiring vias 124.

The second wiring layer 220 may be on the active surface of the second substrate 202. A plurality of second front connection pads 212 may be on the second wiring layer 220, and the plurality of second rear connection pads 214 may be on an inactive surface of the second substrate 202.

The second wiring layer 220 may include a plurality of second wiring patterns 222, a plurality of second wiring vias 224, and a second inter-wiring insulating layer 226. The plurality of second wiring vias 224 may be connected to upper and/or lower surfaces of the plurality of second wiring patterns 222. In an implementation, the plurality of second wiring patterns 222 may be spaced apart from each other at different vertical levels, and the plurality of second wiring vias 224 may connect the second wiring patterns 222 at different vertical levels. The plurality of second wiring patterns 222 and the plurality of second wiring vias 224 may be electrically connected to the plurality of second rear connection pads 214 through the plurality of second through electrodes 230. The second inter-wiring insulating layer 226 may surround the plurality of second wiring patterns 222 and the plurality of second wiring vias 224.

The plurality of second through electrodes 230 may vertically penetrate at least a portion of the second substrate 202 to electrically connect the plurality of second front connection pads 212 to the plurality of second rear connection pads 214. In an implementation, the plurality of second front connection pads 212 may be electrically connected to the plurality of second rear connection pads 214 through the plurality of second through electrodes 230, the plurality of second wiring patterns 222, and the plurality of second wiring vias 224.

Each of the plurality of first wiring patterns 122, the plurality of first wiring vias 124, the plurality of second wiring patterns 222, and the plurality of second wiring vias 224 may include a metal, e.g., Cu, AL, W, Ti, Ta, Mo, Co, Ni, or the like, an alloy thereof, or a nitride containing the metal. The first and second inter-wiring insulating layers 126 and 226 may be each formed of, e.g., high density plasma (HDP) oxide, tetraorthosilicate (TEOS) oxide, Tonen Silazene (TOSZ), spin-on glass (SOG), undoped silica glass (USG), or a low-k dielectric material.

Each of the plurality of first through electrodes 130 and the plurality of second through electrodes 230 may include a conductive plug and a conductive barrier layer enclosing the conductive plug. The conductive plug may include Cu or W. In an implementation, the conductive plug may be formed of, e.g., Cu, CuSn, CuMg, CuNi, copper zinc (CuZn), copper palladium (CuPd) copper gold (CuAu), copper rhenium (CuRe), CuW, W, or a W alloy. In an implementation, the conductive plug may include, e.g., Al, Au, Be, bismuth (Bi), Co, Cu, hafnium (Hf), In, Mn, Mo, Ni, lead (Pb), Pd, platinum (Pt), rhodium (Rh), Re, Ru, Ta, tellurium (Te), Ti, W, Zn, or zirconium (Zr), and may have one or more laminated structures. The conductive barrier layer may include, e.g., W, tungsten nitride (WN), tungsten carbide (WC), Ti, TiN, Ta, tantalum nitride (TaN), Ru, Co, Mn, Ni, or nickel boron (NiB), and may include a single layer or multiple layers.

A plurality of chip connection terminals 250 may be respectively attached to the plurality of second front connection pads 212. Each of the plurality of chip connection terminals 250 may be between corresponding ones of the first rear connection pads 114 and the second front connection pads 212, which are opposite to each other, or between corresponding ones of the second rear connection pads 214 and the second front connection pads 212, which are opposite to each other. In an implementation, the plurality of chip connection terminals 250 may be between the plurality of first rear connection pads 114 and the plurality of second front connection pads 212 attached to the lowermost one of the plurality of second semiconductor chips 200, and between the plurality of second front connection pads 212 attached to each of the remaining second semiconductor chips 200 and the plurality of second rear connection pads 214 attached to another second semiconductor chip 200 underlying the corresponding semiconductor chip 200 to thereby electrically connect the first semiconductor chip 100 and the plurality of second semiconductor chips 200.

The second front connection pads 212 (to which the chip connection terminal 250 are respectively attached) may be referred to as front connection pads, the first and second rear connection pads 114 and 214 (to which the chip connection terminals 250 are respectively attached) may be referred to as rear connection pads, and the first front connection pad 112 may be referred to as an interposer connection pad.

In an implementation, an uppermost second semiconductor chip 200T (positioned farthest from or distal to the first semiconductor chip 100 from among the plurality of second semiconductor chips 200) may not include the second rear connection pad 214 and the second through electrode 230. In an implementation, the uppermost second semiconductor chip 200T may have a thickness greater than those of the remaining, e.g., the other, second semiconductor chips 200.

The insulating adhesive layers 260 may be respectively attached to the inactive surface of the first semiconductor chip 100 and inactive surfaces of the second substrates 202 in the remaining second semiconductor chips 200 (other than the uppermost second semiconductor chip 200T), so that each of the plurality of second semiconductor chips 200 may be attached to its underlying structure, e.g., the first semiconductor chip 100 or another second semiconductor chip 200 underlying the corresponding semiconductor chip 200. Each insulating adhesive layer 260 may include a non-conductive film (NCF), a non-conductive paste (NCP), an insulating polymer, or an epoxy resin. The insulating adhesive layers 260 may surround the chip connection terminals 250 and respectively fill spaces between the first semiconductor chip 100 and the plurality of second semiconductor chips 200.

The first semiconductor chip 100 may have a horizontal width and an area greater than those of each of the plurality of second semiconductor chips 200. Edges of each of the plurality of second semiconductor chips 200 may not be vertically aligned with edges of the first semiconductor chip 100. In an implementation, the plurality of second semiconductor chips 200 may entirely overlap the first semiconductor chip 100 in a vertical direction.

The semiconductor package 1a may further include a molding layer 290 surrounding the plurality of second semiconductor chips 200 and the insulating adhesive layers 260 on the first semiconductor chip 100. The molding layer 290 may be formed of, e.g., an epoxy mold compound (EMC). In an implementation, the molding layer 290 may together or collectively cover side surfaces of the plurality of second semiconductor chips 200, side surfaces of the insulating adhesive layers 260, and an upper surface of the uppermost second semiconductor chip 200T. In an implementation, the molding layer 290 may cover the side surfaces of the plurality of second semiconductor chips 200 and the side surfaces of the insulating adhesive layers 260 and not the upper surface of the uppermost second semiconductor chip 200T. In an implementation, an upper surface of the molding layer 290 may be coplanar with the upper surface, i.e., the inactive surface, of the uppermost second semiconductor chip 200T.

In an implementation, the interposer 300, the first semiconductor chip 100, and the molding layer 290 may all have the same horizontal width and the same area. In an implementation, edges of the interposer 300, the first semiconductor chip 100, and the molding layer 290 may be aligned with one another in a vertical direction.

The first semiconductor chip 100 and the plurality of second semiconductor chips 200 may have the insulating adhesive layer 260 therebetween and may be vertically spaced apart from one another. The first semiconductor chip 100 and the plurality of second semiconductor chips 200 may be spaced apart from each other by a vertical separation gap GP. The vertical separation gap GP may have a value equal to a thickness of the insulating adhesive layer 260 between the first semiconductor chip 100 and the plurality of second semiconductor chips 200. In an implementation, the vertical separation gap GP may be about 6 µm to about 20 µm.

A plurality of support structures PTS may be between the first semiconductor chip 100 and the plurality of second semiconductor chips 200. Each of the plurality of support structures PTS may be formed of a metal. In an implementation, each of the plurality of support structures PTS may be formed of, e.g., Cu, Cu alloys, Ni, stainless steel, BeCu, or the like. The plurality of support structures PTS may be horizontally spaced apart from the plurality of first rear connection pads 114, the plurality of second front connection pads 212, and the plurality of second rear connection pads to which the plurality of chip connection terminals 250 are attached.

Each of the plurality of support structures PTS may include a first support post PT1 attached to the lower surface of the second semiconductor chip 200 and a second support post PT2 attached to the upper surface of the first semiconductor chip 100 or another second semiconductor chip 200, which is opposite to the lower surface of the second semiconductor chip 200 to which the first support post PT1 is attached. In an implementation, each of the plurality of support structures PTS may include the first support post PT1 attached to the second wiring layer 220 and the second support post PT2 that is attached to the inactive surface of the first or second substrate 101 or 202 and is in contact with the first support post PT1.

Referring to FIGS. 1A and 11A together, before stacking the plurality of second semiconductor chips 200 on the first semiconductor chip 100, a plurality of first support posts PT1 and the plurality of second front connection pads 212 may be formed on the second wiring layer 220 of the second semiconductor chip 200, and a plurality of second support posts PT2 and the plurality of second rear connection pads 214 may be formed on the inactive surface of the second substrate 202. In an implementation, in a similar manner to formation of the plurality of second support posts PT2 and the plurality of second rear connection pads 214 on the inactive surface of the second substrate 202, the plurality of second support posts PT2 and the plurality of first rear connection pads 114 may be formed on the inactive surface of the first substrate 102. The plurality of first front connection pads 112 may be formed on the first wiring layer 120 of the first semiconductor chip 100, and the plurality of first support posts PT1 may not be formed thereon. The plurality of chip connection terminals 250 may be respectively attached to the plurality of second front connection pads 212.

In an implementation, the first support post PT1 may be formed to contact the second wiring pattern 222. In an implementation, the second support post PT2 may be formed to contact the first or second through electrode 130 or 230.

Each of the first front connection pad 112, the first rear connection pad 114, the second front connection pad 212, and the second rear connection pad 214 may be formed using a plating process such as electrolytic plating or electroless plating. In an implementation, each of the first front connection pad 112, the first rear connection pad 114, the second front connection pad 212, and the second rear connection pad 214 may include Cu.

Each of the first and second support posts PT1 and PT2 may be formed using a plating process such as electrolytic plating or electroless plating. In an implementation, each of the first and second support posts PT1 and PT2 may include Cu. In an implementation, each of the first and second support posts PT1 and PT2 may have a cylindrical shape, a quadrangular prism shape, a polygonal prism shape in which a planar shape is a polygon, or a wall shape with a horizontal shape of a bar.

In an implementation, each of the first support post PT1 and the second front connection pad 212 may be formed on the second wiring layer 220 of the second semiconductor chip 200 by using a separate plating process. In an implementation, each of the second support post PT2 and the first rear connection pad 114 may be formed on the inactive surface of the first substrate 102 by using a separate plating process. In an implementation, each of the second support post PT2 and the second rear connection pad 214 may be formed on the inactive surface of the second substrate 202 by using a separate plating process.

After forming the first and second support posts PT1 and PT2, the insulating adhesive layer 260 may be attached to the lower surface of the second semiconductor chip 200. The insulating adhesive layer 260 may cover the second wiring layer 220, the plurality of second front connection pads 212, the plurality of chip connection terminals 250, and the plurality of first support posts PT1 of the second semiconductor chip 200.

The semiconductor package 1a may be formed by sequentially stacking, on the first semiconductor chip 100, the plurality of second semiconductor chips 200 with the insulating adhesive layers 260 attached thereto so that the first and second support posts PT1 and PT2 come in contact with each other. The plurality of support structures PTS, each including the first and second support posts PT1 and PT2, may penetrate the insulating adhesive layer 260. The plurality of chip connection terminals 250 may pass through the insulating adhesive layer 260 and be between the plurality of second front connection pads 212 and the plurality of first rear connection pads 114 or the plurality of second front connection pads 212 and the plurality of second rear connection pads 214. As the plurality of support structures PTS and the plurality of chip connection terminals 250 pass through the insulating adhesive layer 260, a portion of the insulating adhesive layer 260 may have a fillet convexly protruding outward from each of the spaces between the first semiconductor chip 100 and the plurality of second semiconductor chips 200.

The second front connection pad 212 may have a first thickness T1, and each of the first rear connection pad 114 and the second rear connection pad 214 may have a second thickness T2. The first support post PT1 may have a third thickness T3, and the second support post PT2 may have a fourth thickness T4. A vertical height of the support structure PTS may be the sum of the third thickness T3 and the fourth thickness T4. In an implementation, the first front connection pad 112 may also have a first thickness T1.

In an implementation, the first thickness T1 may be substantially equal to the second thickness T2. In an implementation, the third thickness T3 may be greater than the first thickness T1, and the fourth thickness T4 may be greater than the second thickness T2. In an implementation, the third thickness T3 may be substantially equal to the fourth thickness T4. In an implementation, each of the third thickness T3 and the fourth thickness T4 may have a value equal to one half of a vertical separation gap GP. In an implementation, the sum of the third thickness T3 and the fourth thickness T4 may be equal to the vertical separation gap GP. In an implementation, the first and second thicknesses T1 and T2 may each have a value of about 1 μm to about 5 μm. In an implementation, the third and fourth thicknesses T3 and T4 may each have a value of about 3 μm to about 10 μm.

A vertical height of each of the plurality of chip connection terminals 250 may be a terminal height HS. The terminal height HS may have a value less than the vertical separation gap GP. In an implementation, the terminal height HS may have a value less than the sum of the third and fourth thicknesses T3 and T4 (that is the vertical height of the support structure PTS). The sum of the first thickness T1, the second thickness T2, and the terminal height HS may be equal to the vertical separation gap GP.

In an implementation, the first and second support posts PT1 and PT2 may have substantially the same horizontal width. The first and second support posts PT1 and PT2 may each have a first horizontal width W1. In an implementation, the second front connection pad 212, the first rear connection pad 114, and the second rear connection pad 214 may have substantially the same horizontal width. In an implementation, each of the second front connection pad 212, the first rear connection pad 114, and the second rear connection pad 214 may have a second horizontal width W2. In an implementation, the first front connection pad 112 may also have the second horizontal width W2. The first horizontal width W1 may be greater than the second horizontal width W2. In an implementation, the second horizontal width W2 may be about 20 μm to about 60 μm, and the first horizontal width W1 may be greater than the second horizontal width W2 and may be greater than 20 μm or less than or equal to about 500 μm. In an implementation, when the first and second support posts PT1 and PT2 have a wall shape in which a horizontal shape is a bar shape, the first horizontal width W1 may be a horizontal width of the bar shape in a minor axis direction.

In the semiconductor package 1a, some of the plurality of first wiring patterns 122, some of the plurality of first wiring vias 124, some of the plurality of first through electrodes 130, some of the plurality of second wiring patterns 222, some of the plurality of second wiring vias 224, and some of the plurality of second through electrodes 230 may correspond to (e.g., overlie or be aligned with) the first and second support posts PT1 and PT2.

The semiconductor package 1a and a method of manufacturing the same may be capable of substantially and uniformly controlling a gap between the first semiconductor chip 100 and the plurality of second semiconductor chips 200 due to the plurality of support structures PTS, each including the first and second support posts PT1 and PT2, between the first semiconductor chip 100 and the plurality of second semiconductor chips 200. This may accordingly help prevent an excessive increase in a volume of a fillet that is formed in a portion of the insulating adhesive layer 260 and protrudes outwardly from a space between the first semiconductor chip 100 and the plurality of second semiconductor chips 200.

Furthermore, in the semiconductor package 1a and the method of manufacturing the same, a distance between the first semiconductor chip 100 and the plurality of second semiconductor chips may be maintained constant by the first and second support posts PT1 and PT2, so that a sufficient pressure may be applied in the process of stacking the plurality of second semiconductor chips 200 on the first semiconductor chip 100. This may help prevent formation of a portion not filled by the insulating adhesive layer 260 so that the semiconductor package 1a may not have voids between the first semiconductor chip 100 and the plurality of second semiconductor chips 200, thereby improving the reliability of the semiconductor package 1a.

In addition, the plurality of support structures PTS may be arranged between the first semiconductor chip 100 and the plurality of second semiconductor chips 200 to connect the first semiconductor chip 100 to one of the plurality of second semiconductor chips 200 adjacent thereto and connect two adjacent ones of the plurality of second semiconductor chips 200 to each other, and thus, heat generated in the first semiconductor chip 100 and the plurality of second semiconductor chips 200 may be smoothly discharged out of the semiconductor package 1a.

Figure 1B:
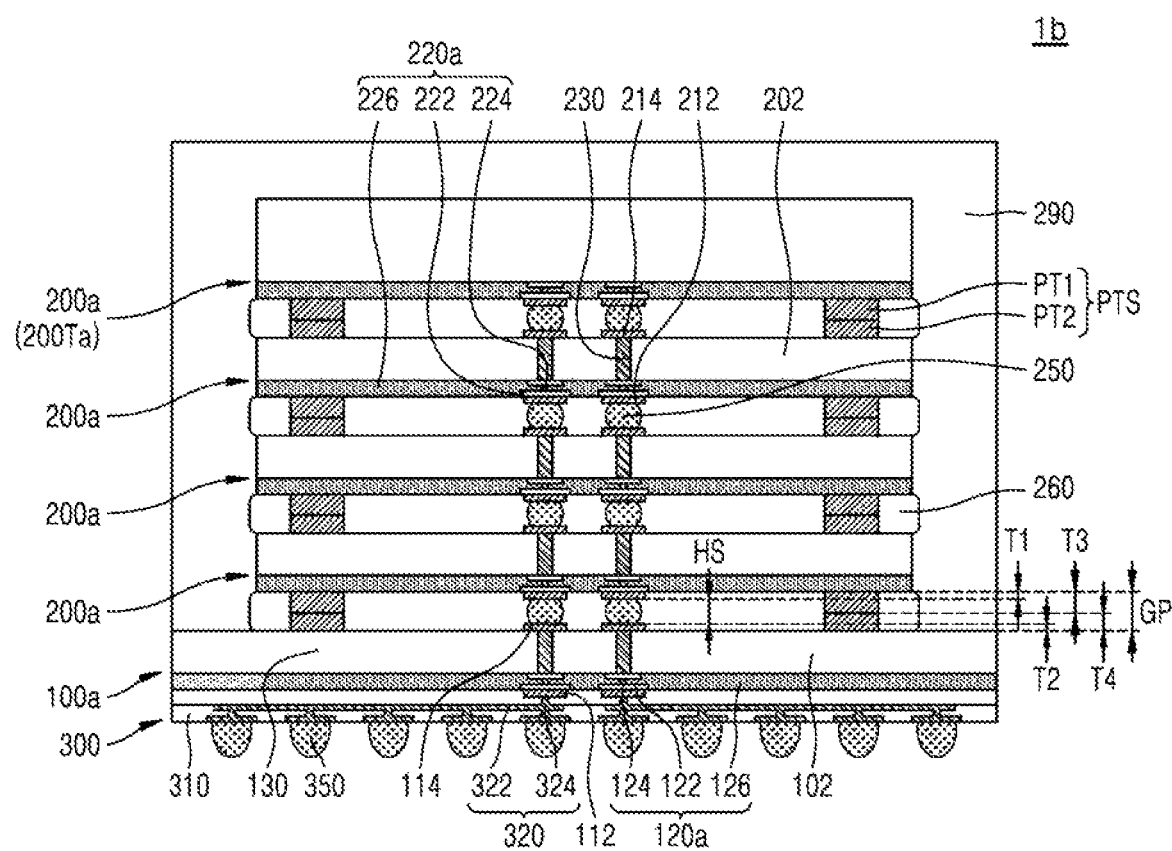

Referring to FIGS. 1B and 11B together, a semiconductor package 1b may include an interposer 300, a first semiconductor chip 100 mounted on the interposer 300, a plurality of second semiconductor chips 200a stacked on the first semiconductor chip 100, and insulating adhesive layers 260 between the first semiconductor chip 100 and the plurality of second semiconductor chips 200.

The first semiconductor chip 100 may include a first substrate 102, a first wiring layer 120, and a plurality of first through electrodes 130. A plurality of first front connection pads 112 may be attached to a lower surface of the first semiconductor chip 100, and a plurality of first rear connection pads 114 may be attached to an upper surface thereof. Each of the plurality of second semiconductor chips 200a may include a second substrate 202, a second wiring layer 220a, and a plurality of second through electrodes 230. A plurality of second front connection pads 212 may be attached to a lower surface of the second semiconductor chip 200a, and a plurality of second rear connection pads 214 may be attached to an upper surface thereof.

The second wiring layer 220a may be on an active surface of the second substrate 202. The plurality of second front connection pads 212 may be on the second wiring layer 220, and the plurality of second rear connection pads 214 may be on an inactive surface of the second substrate 202. The second wiring layer 220a may include a plurality of second wiring patterns 222, a plurality of second wiring vias 224, and a second inter-wiring insulating layer 226.

A plurality of support structures PTS may be between the first semiconductor chip 100 and the plurality of second semiconductor chips 200a.

In an implementation, a first support post PT1 in each of the plurality of support structures PTS may not contact the second wiring pattern 222 of the second wiring layer 220a, and may contact the second inter-wiring insulating layer 226. In an implementation, a second support post PT2 may not contact the first or second through electrode 130 or 230, and may contact the inactive surface of the first or second substrate 102 or 202.

In an implementation, different from the semiconductor package 1a of FIG. 1A, the semiconductor package 1b of FIG. 1B may not include the first wiring pattern 122, the first wiring via 124, the first through electrode 130, the second wiring pattern 222, the second wiring via 224, and the second through electrode 230 corresponding to the first and second support posts PT1 and PT2.

Figure 2A:
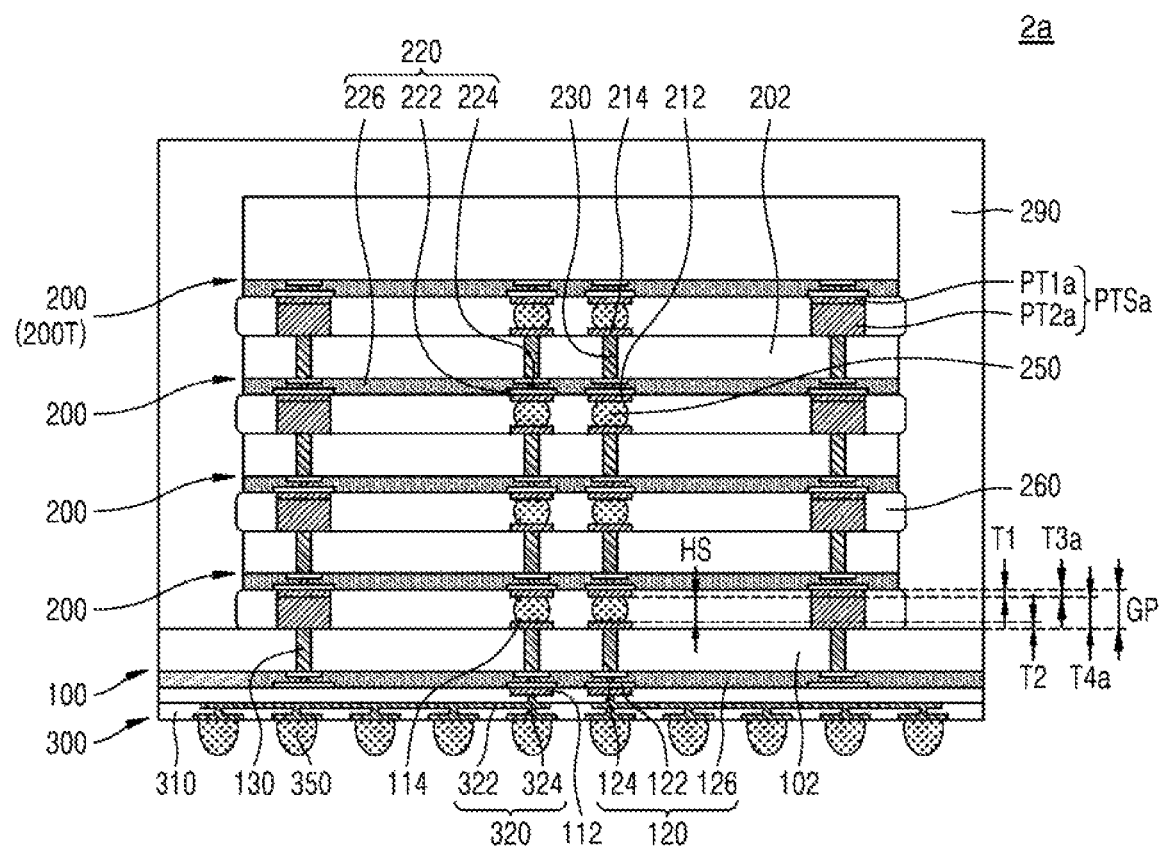

Referring to FIGS. 2A and 11C together, a semiconductor package 2a may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSa may be between the first semiconductor chip 100 and the plurality of second semiconductor chips 200. Each of the plurality of support structures PTSa may include a first support post PT1a attached to a second wiring layer 220 and a second support post PT2a that is attached to an inactive surface of a first or second substrate 102 or 202 and contacts the first support post PT1a.

In an implementation, the first support post PT1a may be formed to contact a second wiring pattern 222. In an implementation, the second support post PT2a may be formed to contact a first or second through electrode 130 or 230.

A second front connection pad 212 may have a first thickness T1, and each of a first rear connection pad 114 and a second rear connection pad 214 may have a second thickness T2. The first support post PT1a may have a third thickness T3a, and the second support post PT2a may have a fourth thickness T4a.

In an implementation, the first thickness T1 may be substantially equal to the third thickness T3a. The fourth thickness T4a may be greater than the third thickness T3a. The sum of the third thickness T3a and the fourth thickness T4a may be equal to a vertical separation gap GP. In an implementation, the third thickness T3a may have a value of about 1 μm to about 5 and the fourth thickness T4a may be greater than the third thickness T3a and have a value of about 5 μm to about 19 μm.

In an implementation, a plurality of first support posts PT1a and a plurality of second front connection pads 212 may be formed together on the second wiring layer 220 of the second semiconductor chip 200 by using a plating process (e.g., a single plating process). In an implementation, each of the second support post PT2*a* and the first rear connection pad 114 may be formed on the inactive surface of the first substrate 102 by using a separate plating process. In an implementation, each of the second support post PT2*a* and the second rear connection pad 214 may be formed on the inactive surface of the second substrate 202 by using a separate plating process.

Figure 2B:
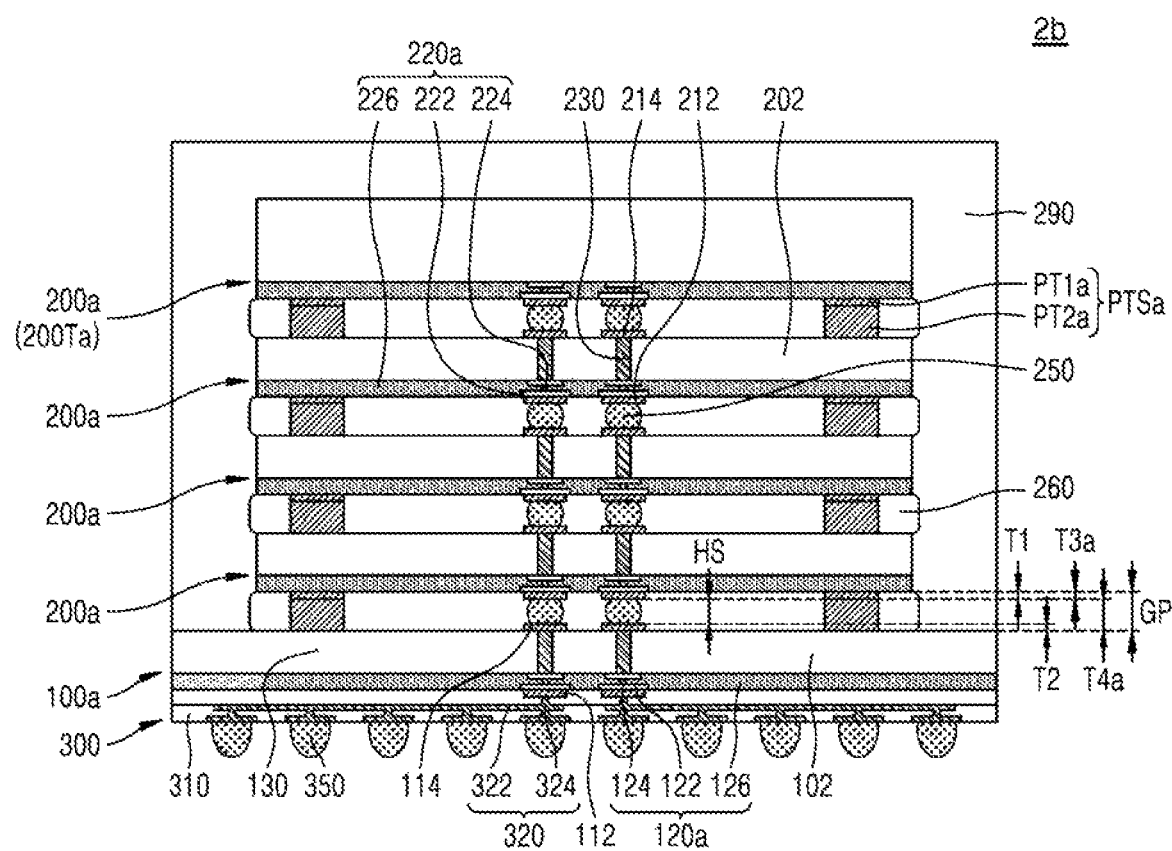

Referring to FIGS. 2B and 11D together, a semiconductor package 2*b* may include an interposer 300, a first semiconductor chip 100 mounted on the interposer 300, a plurality of second semiconductor chips 200*b* stacked on the first semiconductor chip 100, and insulating adhesive layers 260 between the first semiconductor chip 100 and the plurality of second semiconductor chips 200*a*.

A plurality of support structures PTSa may be between the first semiconductor chip 100 and the plurality of second semiconductor chips 200*a*. Each of the plurality of support structures PTSa may include a first support post PT1*a* attached to a second wiring layer 220*a* and a second support post PT2*a* that is attached to an inactive surface of a first or second substrate 102 or 202 and contacts the first support post PT1*a*. In an implementation, the support structures PTSa may be electrically isolated.

Figure 3A:
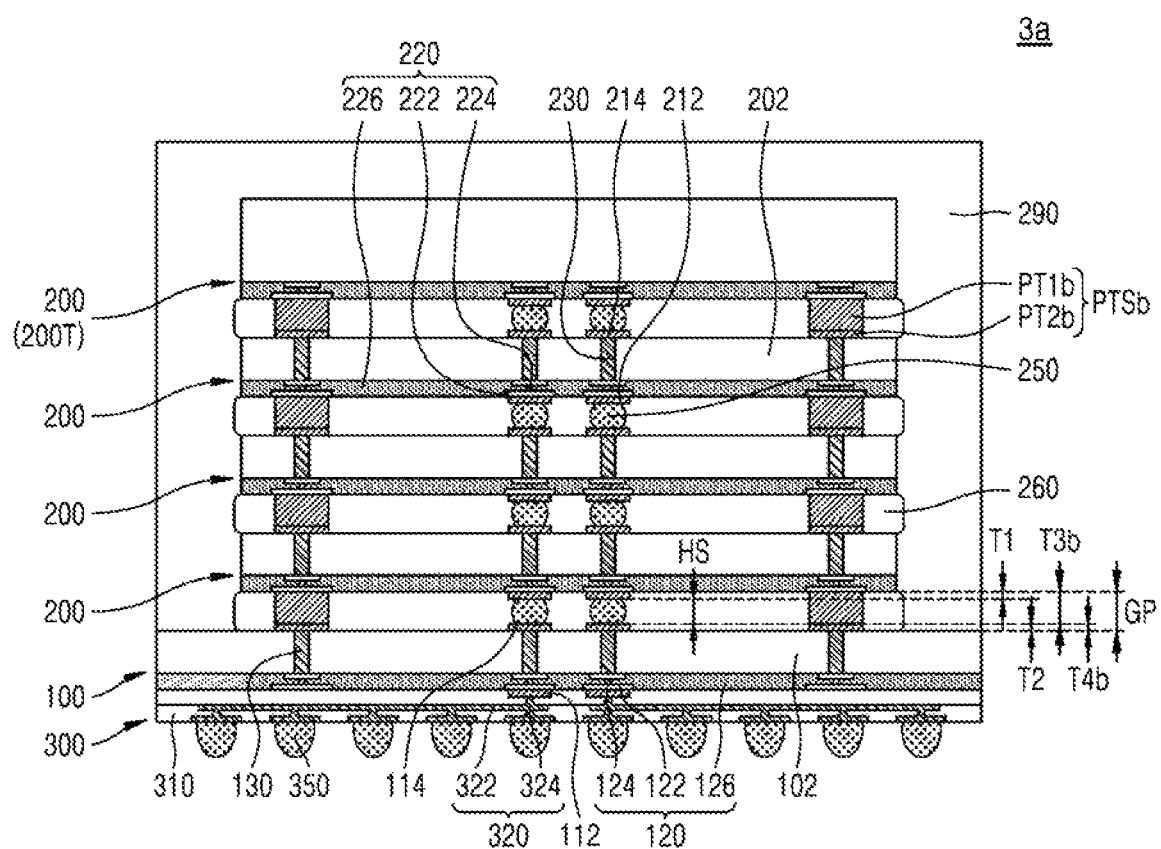

Referring to FIGS. 3A and 11E together, a semiconductor package 3*a* may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSb may be between the first semiconductor chip 100 and the plurality of second semiconductor chips 200. Each of the plurality of support structures PTSb may include a first support post PT1*b* attached to a second wiring layer 220 and a second support post PT2*b* that is attached to an inactive surface of a first or second substrate 102 or 202 and contacts the first support post PT1*b*.

In an implementation, the first support post PT1*b* may be formed to contact a second wiring pattern 222. In an implementation, the second support post PT2*b* may be formed to contact a first or second through electrode 130 or 230.

A second front connection pad 212 may have a first thickness T1, and each of a first rear connection pad 114 and a second rear connection pad 214 may have a second thickness T2. The first support post PT1*b* may have a third thickness T3*b*, and the second support post PT2*b* may have a fourth thickness T4*b*.

In an implementation, the second thickness T2 may be substantially equal to the fourth thickness T4*b*. The third thickness T3*b* may be greater than the fourth thickness T4*b*. The sum of the third thickness T3*b* and the fourth thickness T4*b* may be equal to a vertical separation gap GP. In an implementation, the third thickness T3*b* may have a value of about 5 μm to about 19 and the fourth thickness T4*b* may be less than the third thickness T3*b* and have a value of about 1 μm to about 5 μm.

In an implementation, a plurality of first support posts PT1*b* and a plurality of second front connection pads 212 may be respectively formed on the second wiring layer 220 of the second semiconductor chip 200 by using separate plating processes. In an implementation, each of the second support post PT2*b* and the first rear connection pad 114 may be formed together on the inactive surface of the first substrate 102 by using a plating process. In an implementation, the second support post PT2*b* and the second rear connection pad 214 may be formed together on the inactive surface of the second substrate 202 by using a plating process.

Figure 3B:
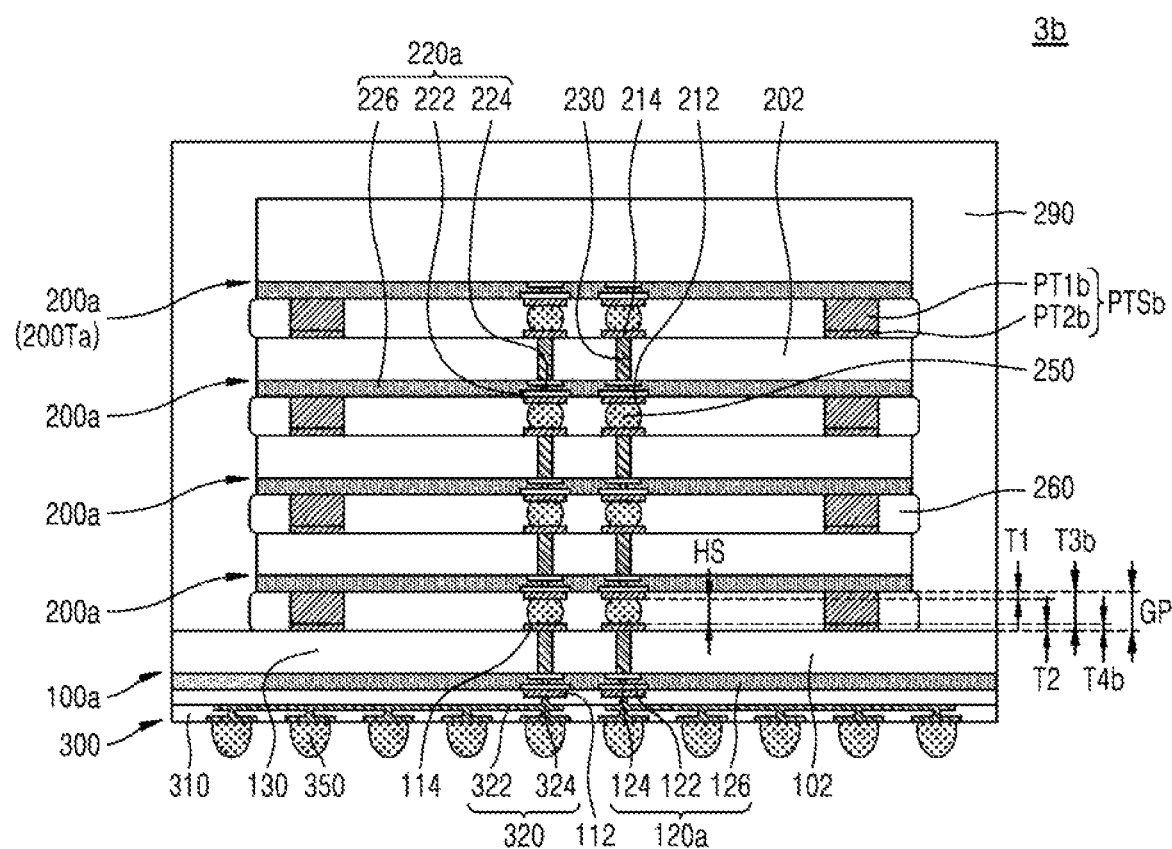

Referring to FIGS. 3B and 11F together, a semiconductor package 3*b* may include an interposer 300, a first semiconductor chip 100 mounted on the interposer 300, a plurality of second semiconductor chips 200*a* stacked on the first semiconductor chip 100, and insulating adhesive layers 260 between the first semiconductor chip 100 and the plurality of second semiconductor chips 200*a*.

A plurality of support structures PTSb may be between the first semiconductor chip 100 and the plurality of second semiconductor chips 200*a*. Each of the plurality of support structures PTSb may include a first support post PT1*b* attached to a second wiring layer 220*a* and a second support post PT2*b* that is attached to an inactive surface of a first or second substrate 102 or 202 and contacts the first support post PT1*b*. In an implementation, the support structures PTSb may be electrically isolated.

Figure 4A:
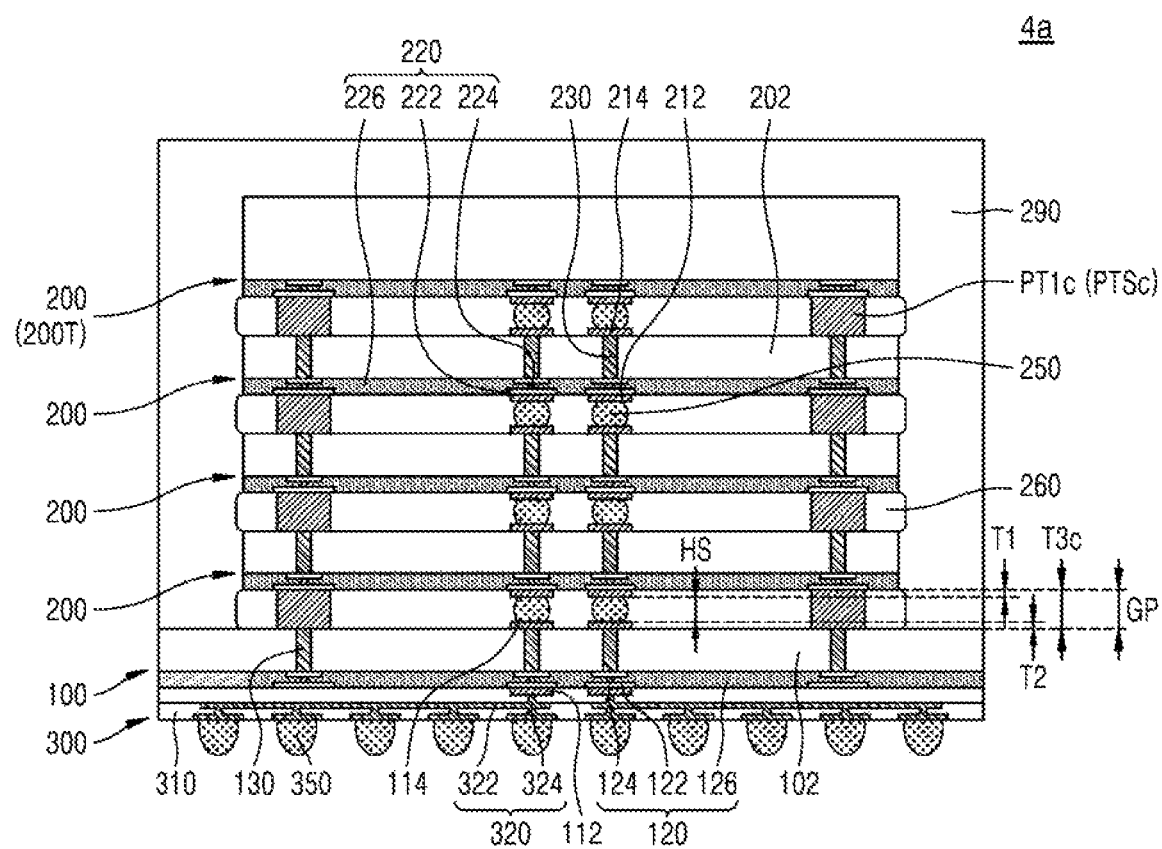

Referring to FIGS. 4A and 11G together, a semiconductor package 4*a* may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSc may be between the first semiconductor chip 100 and the plurality of second semiconductor chips 200. Each of the plurality of support structures PTSc may include only a first support post PT1*c*. In an implementation, an upper surface of the first support post PT1*c* may contact a second wiring layer 220, and a lower surface of the first support post PT1*c* may contact an inactive surface of a first or second substrate 102 or 202. In an implementation, the upper surface of the first support post PT1*c* may contact a second wiring pattern 222, and the lower surface of the first support post PT1*c* may contact a first or second through electrode 130 or 230.

A second front connection pad 212 may have a first thickness T1, and each of a first rear connection pad 114 and a second rear connection pad 214 may have a second thickness T2. The first support post PT1*c* may have a third thickness T3*c*.

In an implementation, the third thickness T3*c* may be substantially equal to a vertical separation gap GP. In an implementation, the third thickness T3*c* may be about 6 μm to about 20 μm.

In an implementation, a plurality of first support posts PT1*c* and a plurality of second front connection pads 212 may be respectively formed on the second wiring layer 220 of the second semiconductor chip 200 by using separate plating processes.

Figure 4B:
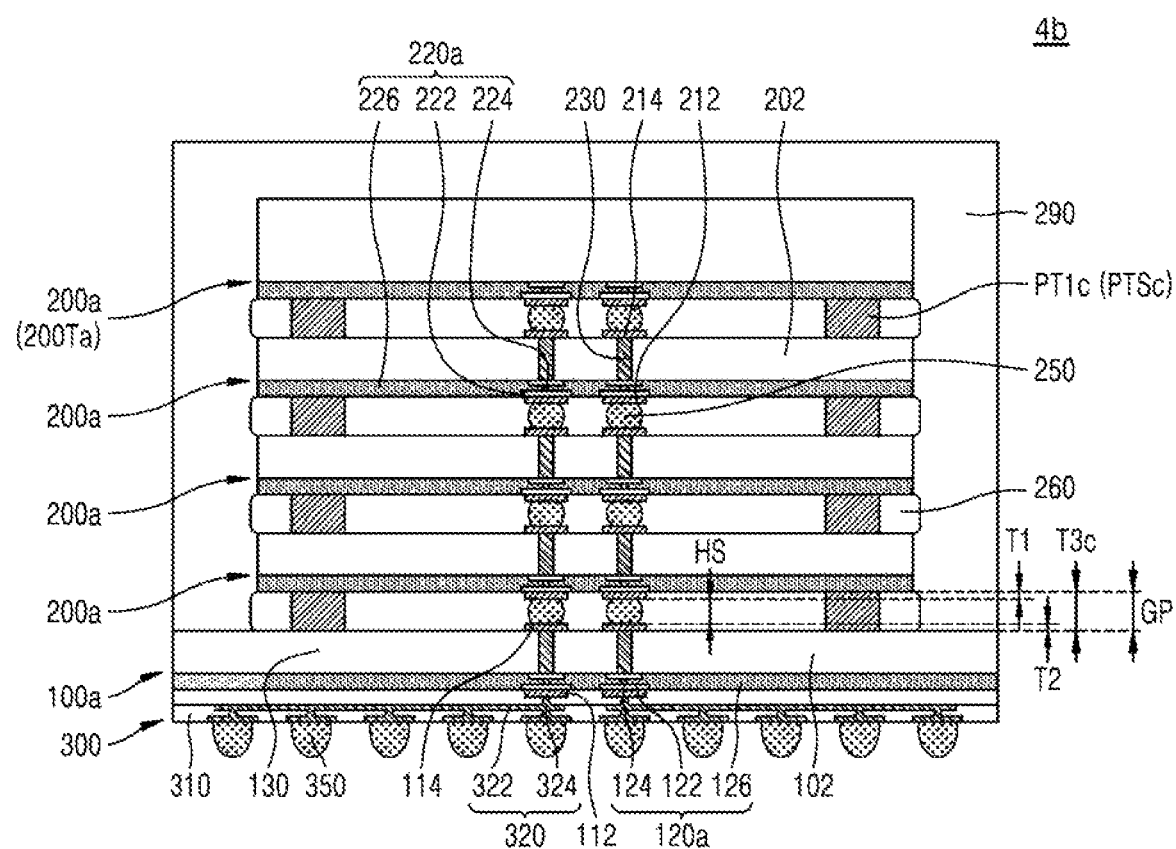

Referring to FIGS. 4B and 11H together, a semiconductor package 4*b* may include an interposer 300, a first semiconductor chip 100 mounted on the interposer 300, a plurality of second semiconductor chips 200*a* stacked on the first semiconductor chip 100, and insulating adhesive layers 260 between the first semiconductor chip 100 and the plurality of second semiconductor chips 200*a*.

A plurality of support structures PTSc may be between the first semiconductor chip 100 and the plurality of second semiconductor chips 200*a*. Each of the plurality of support structures PTSc may include only a first support post PT having an upper surface attached to a second wiring layer 220*a* and a lower surface attached to an inactive surface of a first or second substrate 102 or 202. In an implementation, the support structures PTSc may be electrically isolated.

Figure 5A:
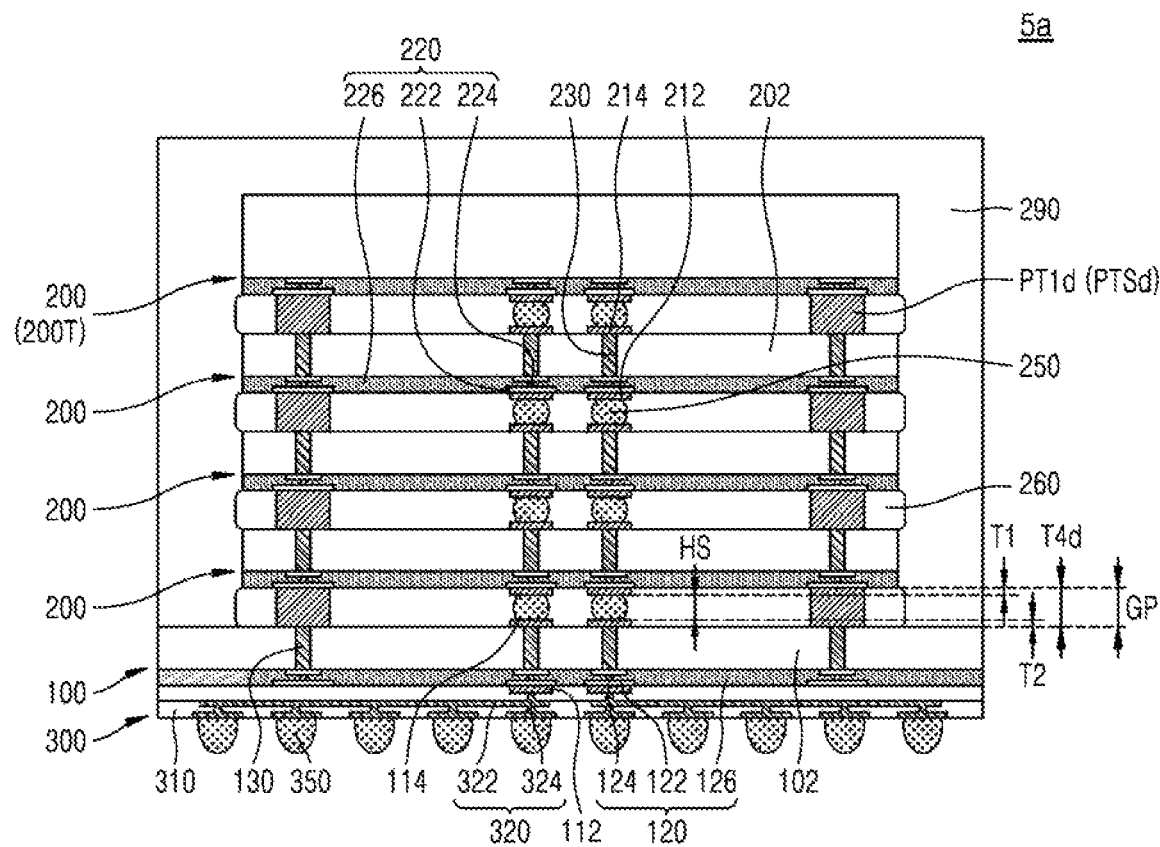

Referring to FIGS. 5A and 11I together, a semiconductor package 5a may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSd may be between the first semiconductor chip 100 and the plurality of second semiconductor chips 200. Each of the plurality of support structures PTSd may include only a second support post PT2d. In an implementation, an upper surface of the second support post PT2d may contact a second wiring layer 220, and a lower surface of the second support post PT2d may contact an inactive surface of a first or second substrate 102 or 202. In an implementation, the upper surface of the second support post PT2d may contact a second wiring pattern 222, and the lower surface of the second support post PT2d may contact a first or second through electrode 130 or 230.

A second front connection pad 212 may have a first thickness T1, and each of a first rear connection pad 114 and a second rear connection pad 214 may have a second thickness T2. The second support post PT2d may have a fourth thickness T4d.

In an implementation, the fourth thickness T4d may be substantially equal to a vertical separation gap GP. In an implementation, the fourth thickness T4d may be about 6 μm to about 20 μm.

In an implementation, each of the second support post PT2d and the first rear connection pad 114 may be formed on the inactive surface of the first substrate 102 by using a separate plating process. In an implementation, each of the second support post PT2d and the second rear connection pad 214 may be formed on the inactive surface of the second substrate 202 by using a separate plating process.

Figure 5B:
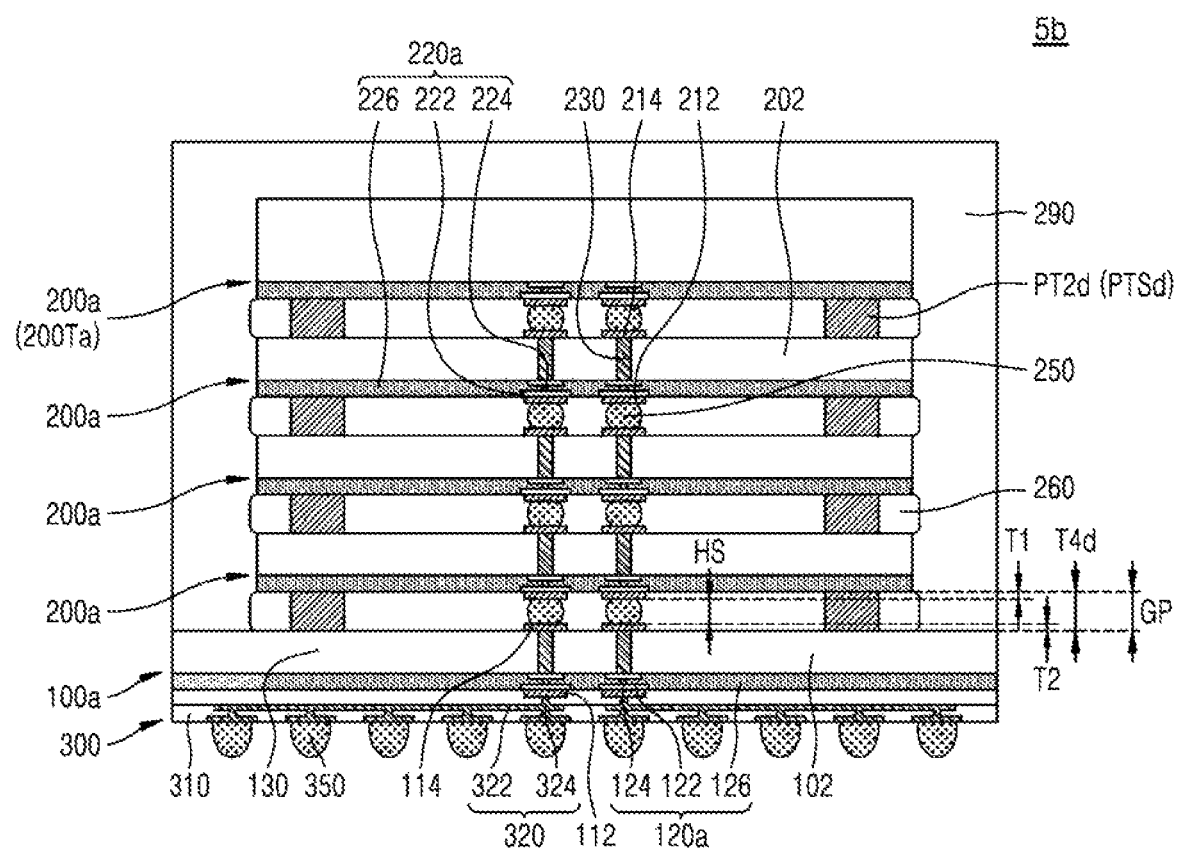

Referring to FIGS. 5B and 11J together, a semiconductor package 5b may include an interposer 300, a first semiconductor chip 100 mounted on the interposer 300, a plurality of second semiconductor chips 200a stacked on the first semiconductor chip 100, and insulating adhesive layers 260 between the first semiconductor chip 100 and the plurality of second semiconductor chips 200a.

A plurality of support structures PTSd may be between the first semiconductor chip 100 and the plurality of second semiconductor chips 200a. Each of the plurality of support structures PTSd may include only a second support post PT2d having an upper surface attached to a second wiring layer 220a and a lower surface attached to an inactive surface of a first or second substrate 102 or 202. In an implementation, the second support post PT2d may be electrically isolated.

Figure 6A:
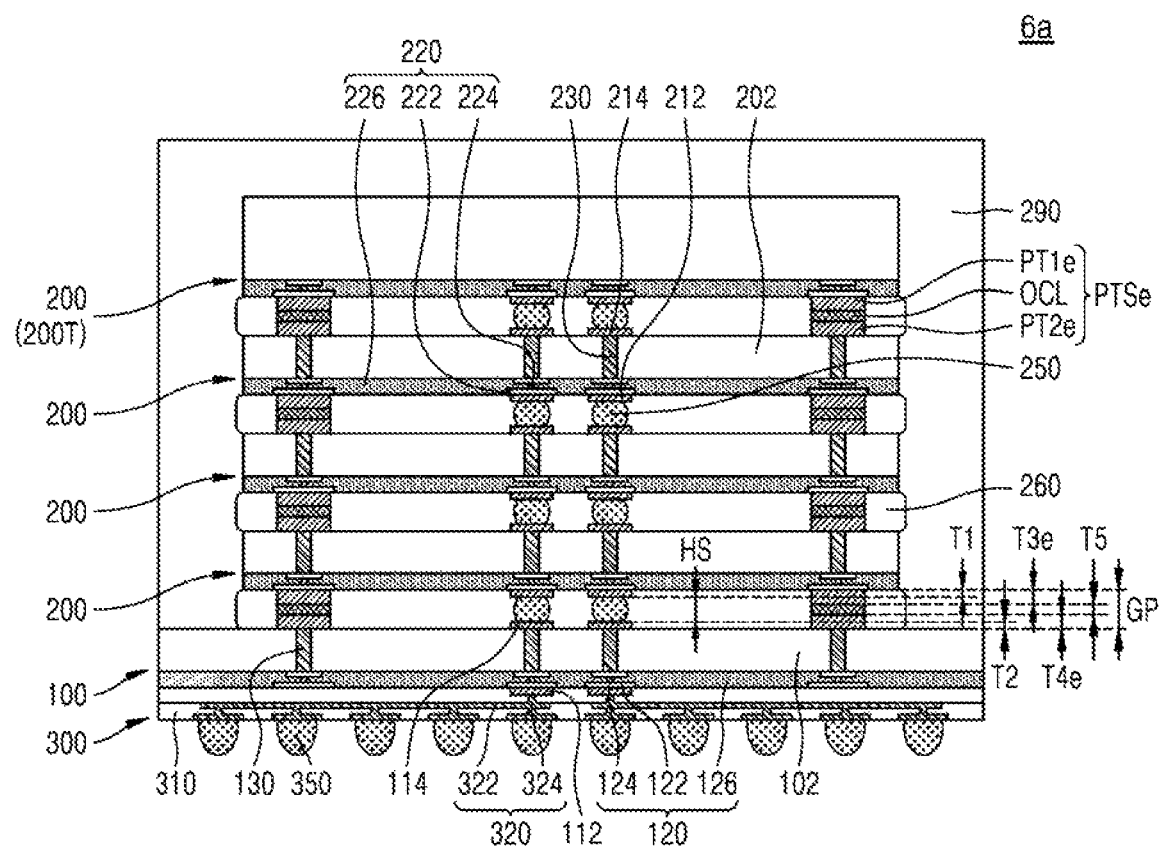

Referring to FIGS. 6A and 11K together, a semiconductor package 6a may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSe may be between the first semiconductor chip 100 and the plurality of second semiconductor chips 200. Each of the plurality of support structures PTSe may include a first support post PT1e attached to a second wiring layer 220, a second support post PT2e attached to an inactive surface of a first or second substrate 102 or 202, and a buffer layer OCL between the first and second support posts PT1e and PT2e. An upper surface of the buffer layer OCL may contact a lower surface of the first support post PT1e, and a lower surface thereof may contact an upper surface of the second support post PT2e. In an implementation, the buffer layer OCL may be formed of an organic material.

In an implementation, the first support post PT1e may contact a second wiring pattern 222. In an implementation, the second support post PT2e may contact a first or second through electrode 130 or 230.

A second front connection pad 212 may have a first thickness T1, and each of a first rear connection pad 114 and a second rear connection pad 214 may have a second thickness T2. The first support post PT1e may have a third thickness T3e, the second support post PT2e may have a fourth thickness T4e, and the buffer layer OCL may have a fifth thickness T5.

In an implementation, the third thickness T3e may be greater than the first thickness T1, and the fourth thickness T4e may be greater than the second thickness T2. In an implementation, the third thickness T3e may be substantially equal to the fourth thickness T4e. In an implementation, each of the third thickness T3e and the fourth thickness T4e may have a value less than one half of a vertical separation gap GP. The sum of the third, fourth, and fifth thicknesses T3, T4e, and T5 may be equal to the vertical separation gap GP. In an implementation, the first and second thicknesses T1 and T2 may each have a value of about 1.8 μm to about 9.8 μm. The fifth thickness T5 may have a value of about 0.4 μm to about 5 μm.

Each of a plurality of chip connection terminals 250 may have a terminal height HS. The terminal height HS may have a value greater than the fifth thickness T5. The terminal height HS may be about 4 μm to about 8 and each of the first and second thicknesses T1 and T2 may be about 1 μm to about 15 μm.

In an implementation, each of the first support post PT1e and the second front connection pad 212 may be formed on the second wiring layer 220 of the second semiconductor chip 200 by using a separate plating process. In an implementation, each of the second support post PT2e and the first rear connection pad 114 may be formed on the inactive surface of the first substrate 102 by using a separate plating process. In an implementation, each of the second support post PT1b and the second rear connection pad 214 may be formed on the inactive surface of the second substrate 202 by using a separate plating process.

In an implementation, after the buffer layer OCL is formed on the second support post PT2e, the plurality of second semiconductor chips 200 with the insulating adhesive layers 260 attached thereto may be sequentially stacked on the first semiconductor chip 100 so that the buffer layer OCL is between the first and second support posts PT1e and PT2e, thereby forming the semiconductor package 6a.

Figure 6B:
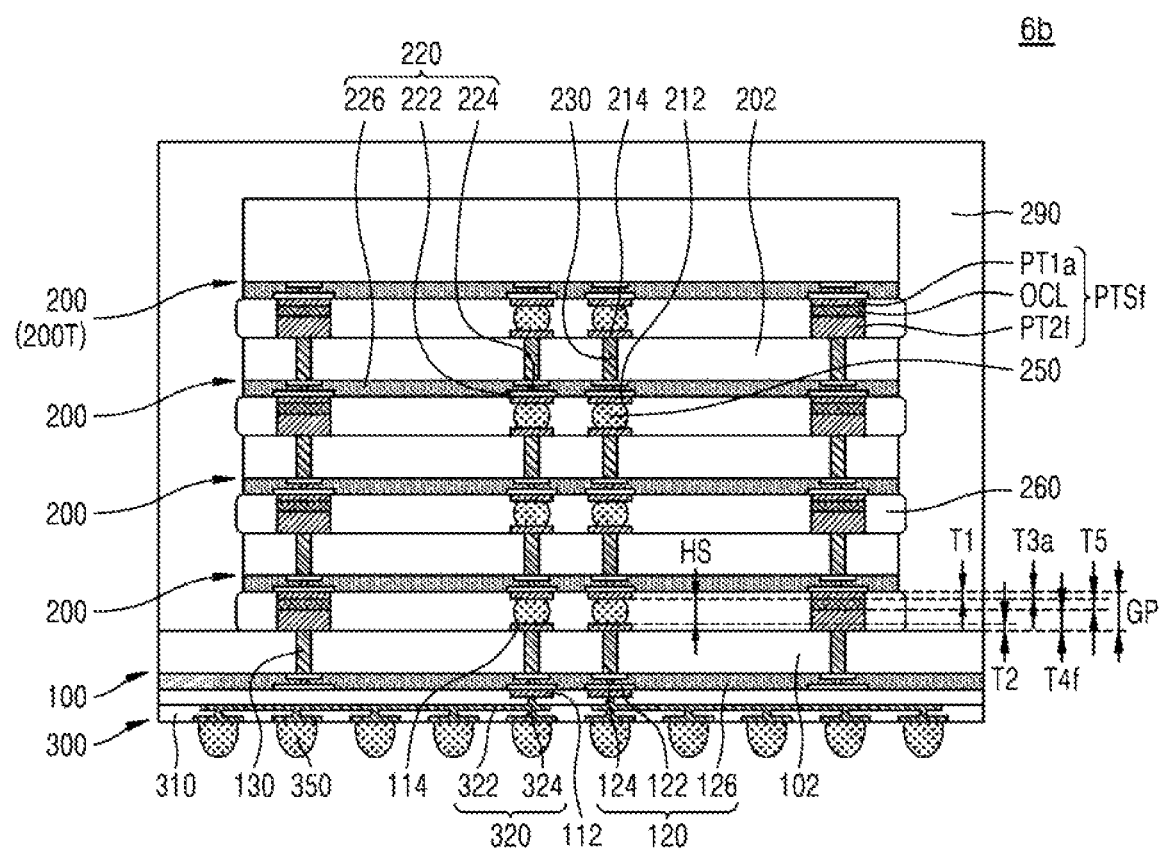

Referring to FIGS. 6B and 11L together, a semiconductor package 6b may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSf may be between the first semiconductor chip 100 and the plurality of second semiconductor chips 200. Each of the plurality of support structures PTSf may include a first support post PT1a attached to a second wiring layer 220, a second support post PT2*f* attached to an inactive surface of a first or second substrate 102 or 202, and a buffer layer OCL between the first and second support posts PT1*a* and PT2*f*. An upper surface of the buffer layer OCL may contact a lower surface of the first support post PT1*a*, and a lower surface thereof may contact an upper surface of the second support post PT2*f*.

In an implementation, the first support post PT1*a* may contact a second wiring pattern 222. In an implementation, the second support post PT2*f* may contact a first or second through electrode 130 or 230.

A second front connection pad 212 may have a first thickness T1, and each of a first rear connection pad 114 and a second rear connection pad 214 may have a second thickness T2. The first support post PT1*a* may have a third thickness T3*a*, the second support post PT2*f* may have a fourth thickness T4*f*, and the buffer layer OCL may have a fifth thickness T5.

In an implementation, the first thickness T1 may be substantially equal to the third thickness T3*a*. The fourth thickness T4*f* may be greater than each of the second thickness T2 and the third thickness T3*a*. The sum of the third, fourth, and fifth thicknesses T3*a*, T4*f*, and T5 may be equal to a vertical separation gap GP. In an implementation, the third thickness T3*a* may have a value of about 1 µm to about 5 µm, and the fourth thickness T4*f* may be greater than the third thickness T3*a* and have a value of about 4.6 µm to about 19.6 µm.

In an implementation, a plurality of first support posts PT1*a* and a plurality of second front connection pads 212 may be formed together on the second wiring layer 220 of the second semiconductor chip 200 by using a plating process. In an implementation, each of the second support post PT2*f* and the first rear connection pad 114 may be formed on the inactive surface of the first substrate 102 by using a separate plating process. In an implementation, each of the second support post PT2*f* and the second rear connection pad 214 may be formed on the inactive surface of the second substrate 202 by using a separate plating process.

In an implementation, after the buffer layer OCL is formed on the second support post PT2*f*, the plurality of second semiconductor chips 200 with the insulating adhesive layers 260 attached thereto may be sequentially stacked on the first semiconductor chip 100 so that the buffer layer OCL is between the first and second support posts PT1*a* and PT2*f*, thereby forming the semiconductor package 6*b*.

Figure 6C:
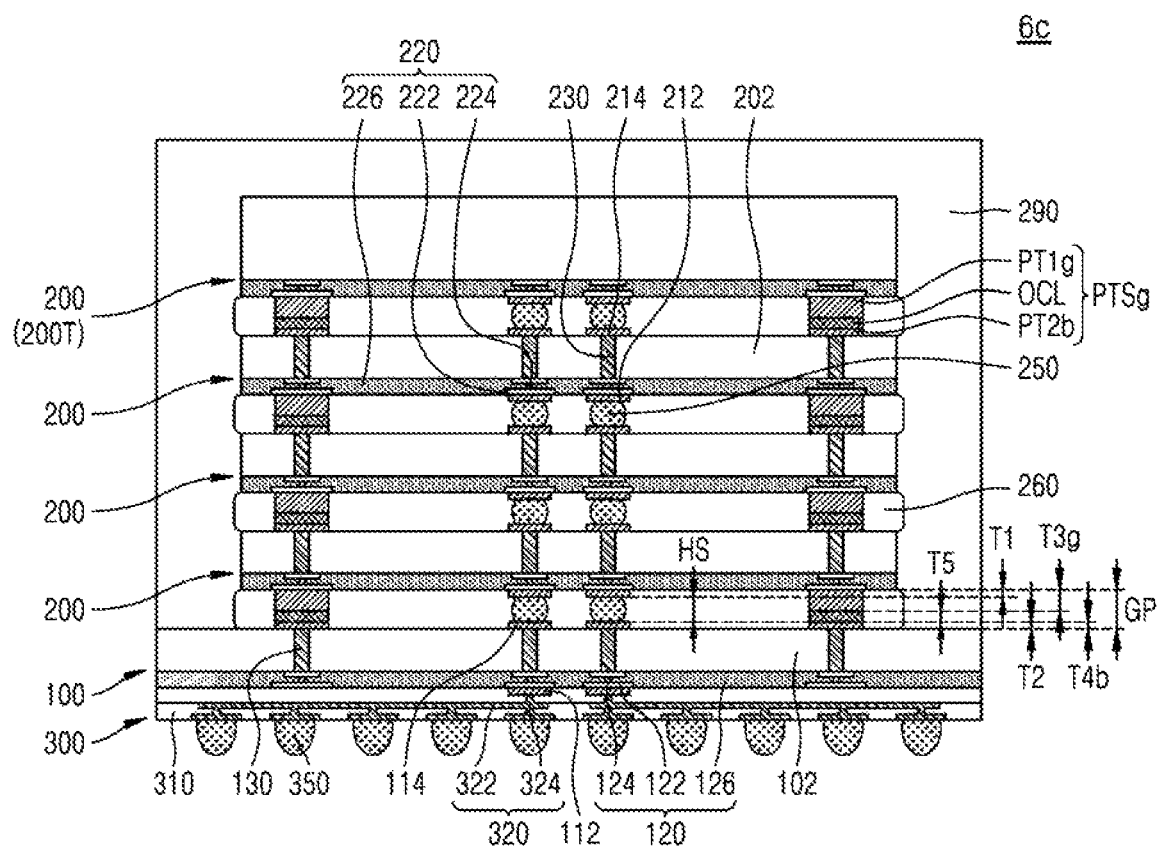

Referring to FIGS. 6C and 11M together, a semiconductor package 6*c* may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSg may be between the first semiconductor chip 100 and the plurality of second semiconductor chips 200. Each of the plurality of support structures PTSg may include a first support post PT1*g* attached to a second wiring layer 220, a second support post PT2*b* attached to an inactive surface of a first or second substrate 102 or 202, and a buffer layer OCL between the first and second support posts PT1*g* and PT2*b*. An upper surface of the buffer layer OCL may contact a lower surface of the first support post PT1*g*, and a lower surface thereof may contact an upper surface of the second support post PT2*b*.

In an implementation, the first support post PT1*g* may contact a second wiring pattern 222. In an implementation, the second support post PT2*b* may contact a first or second through electrode 130 or 230.

A second front connection pad 212 may have a first thickness T1, and each of a first rear connection pad 114 and a second rear connection pad 214 may have a second thickness T2. The first support post PT1*a* may have a third thickness T3*g*, the second support post PT2*b* may have a fourth thickness T4*b*, and the buffer layer OCL may have a fifth thickness T5.

In an implementation, the second thickness T2 may be substantially equal to the fourth thickness T4*b*. The third thickness T3*g* may be greater than each of the first thickness T1 and the fourth thickness T4*b*. The sum of the third, fourth, and fifth thicknesses T3*g*, T4*b*, and T5 may be equal to a vertical separation gap GP. In an implementation, the fourth thickness T4*b* may have a value of about 1 µm to about 5 µm, and the third thickness T3*g* may be greater than the fourth thickness T4*b* and have a value of about 3.6 µm to about 18.6 µm.

In an implementation, a plurality of first support posts PT1*g* and a plurality of second front connection pads 212 may be respectively formed on the second wiring layer 220 of the second semiconductor chip 200 by using separate plating processes. In an implementation, each of the second support post PT2*b* and the first rear connection pad 114 may be formed together on the inactive surface of the first substrate 102 by using a plating process. In an implementation, the second support post PT2*b* and the second rear connection pad 214 may be formed together on the inactive surface of the second substrate 202 by using a plating process.

In an implementation, after the buffer layer OCL is formed on the second support post PT2*b*, the plurality of second semiconductor chips 200 with the insulating adhesive layers 260 attached thereto may be sequentially stacked on the first semiconductor chip 100 so that the buffer layer OCL is between the first and second support posts PT1*g* and PT2*b*, thereby forming the semiconductor package 6*c*.

Figure 6D:
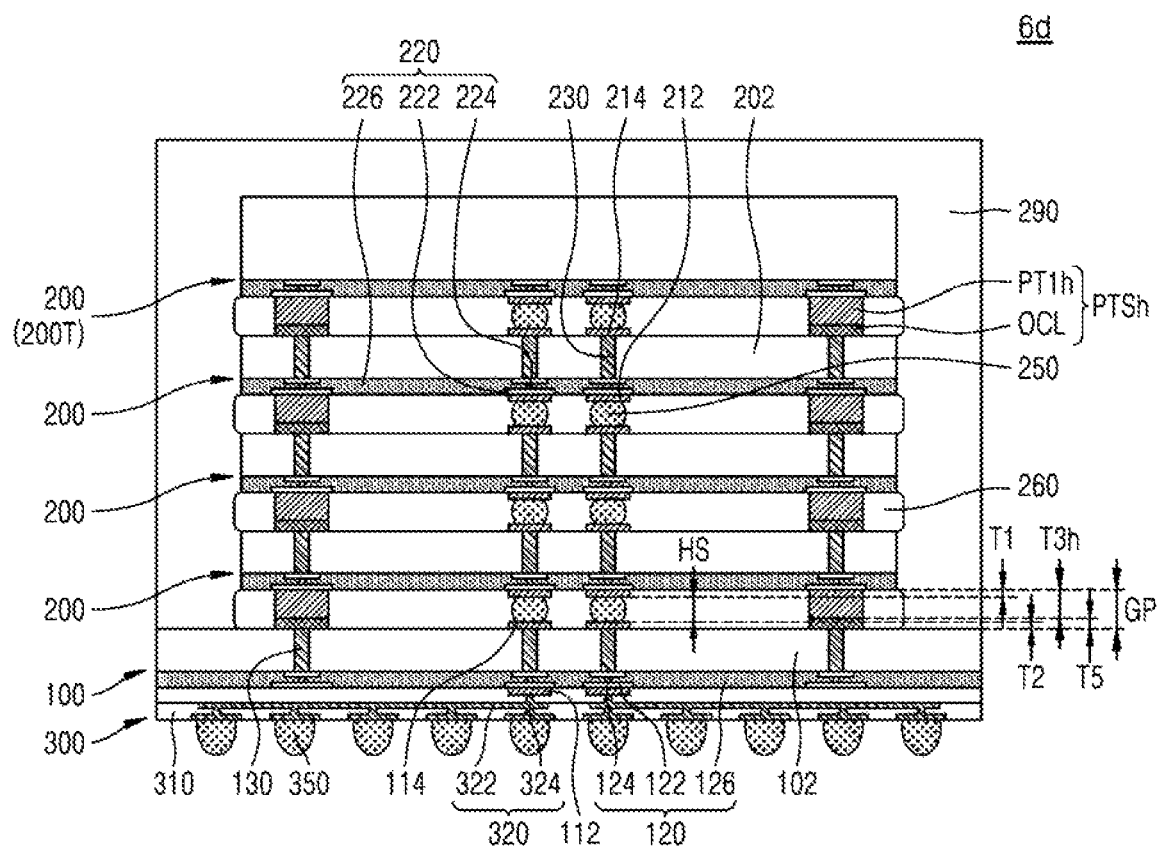

Referring to FIGS. 6D and 11N together, a semiconductor package 6*d* may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSh may be between the first semiconductor chip 100 and the plurality of second semiconductor chips 200. Each of the plurality of support structures PTSh may include a first support post PT1*h* attached to a second wiring layer 220 and a buffer layer OCL attached to an inactive surface of a first or second substrate 102 or 202. An upper surface of the buffer layer OCL may contact a lower surface of the first support post PT1*h*, and a lower surface thereof may contact an inactive surface of the first or second substrate 102 or 202.

In an implementation, the first support post PT1*h* may contact a second wiring pattern 222. In an implementation, the buffer layer OCL may contact a first or second through electrode 130 or 230.

The first support post PT1*h* may have a third thickness T3*h*, and the buffer layer OCL may have a fifth thickness T5. The third thickness T3*h* may be greater than a first thickness T1. In an implementation, the sum of the third and fifth thicknesses T3*h* and T5 may be equal to a vertical separation gap GP. In an implementation, the third thickness T3*h* may be about 5.6 µm to about 19.6 µm.

In an implementation, a plurality of first support posts PT1*h* and a plurality of second front connection pads 212 may be respectively formed on the second wiring layer 220 of the second semiconductor chip 200 by using separate plating processes.

In an implementation, after the buffer layer OCL is formed on the inactive surface of the first or second substrate 102 or 202, the plurality of second semiconductor chips 200 with the insulating adhesive layers 260 attached thereto may be sequentially stacked on the first semiconductor chip 100 so that the first support post PT1*h* comes in contact with the buffer layer OCL, thereby forming the semiconductor package 6*d*.

Figure 6E:
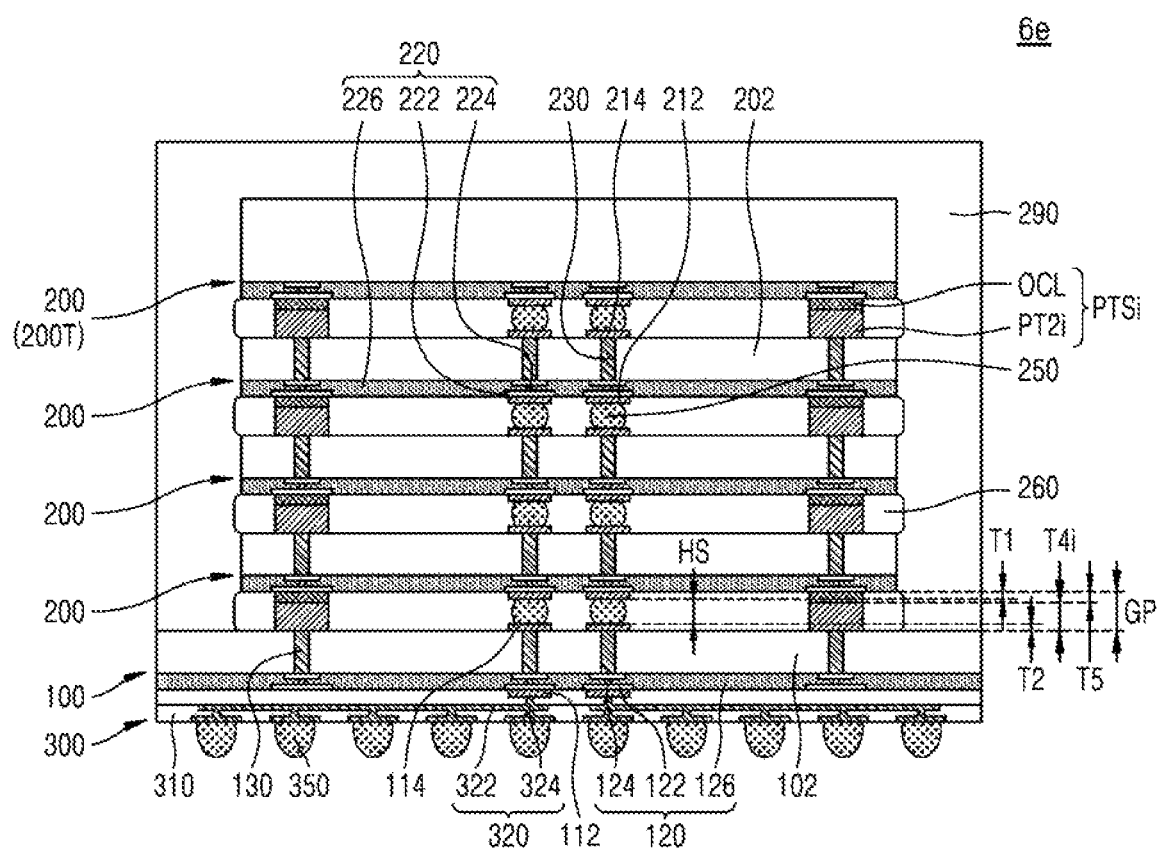

Referring to FIGS. 6E and 11O together, a semiconductor package 6*e* may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSi may be between the first semiconductor chip 100 and the plurality of second semiconductor chips 200. Each of the plurality of support structures PTSi may include a buffer layer OCL and a second support post PT2*i* attached to an inactive surface of a first or second substrate 102 or 202. An upper surface of the buffer layer OCL may contact a second wiring layer 220, and a lower surface thereof may contact an upper surface of the second support post PT2*i*.

In an implementation, the buffer layer OCL may contact a second wiring pattern 222. In an implementation, the second support post PT2*i* may contact a first or second through electrode 130 or 230.

The second support post PT2*i* may have a fourth thickness T4*i*, and the buffer layer OCL may have a fifth thickness T5. The fourth thickness T4*i* may be greater than a second thickness T2. In an implementation, the sum of the fourth and fifth thicknesses T4*i* and T5 may be equal to a vertical separation gap GP. In an implementation, the fourth thickness T4*i* may be about 5.6 µm to about 19.6 µm.

In an implementation, each of the second support post PT2*i* and the first rear connection pad 114 may be formed on the inactive surface of the first substrate 102 by using a separate plating process. In an implementation, each of the second support post PT2*i* and the second rear connection pad 214 may be formed on the inactive surface of the second substrate 202 by using a separate plating process.

In an implementation, after the buffer layer OCL is formed on the second support post PT2*i*, the plurality of second semiconductor chips 200 with the insulating adhesive layers 260 attached thereto may be sequentially stacked on the first semiconductor chip 100 so that the buffer layer OCL comes in contact with the second wiring layer 220, thereby forming the semiconductor package 6*e*.

In an implementation, as illustrated in FIGS. 6A through 6E, the semiconductor packages 6*a*, 6*b*, 6*c*, 6*d*, and 6*e* may each include the second semiconductor chip 200 including the second wiring layer 220. In an implementation, the semiconductor packages 6*a*, 6*b*, 6*c*, 6*d*, and 6*e* may each include the second semiconductor chip 200*a* having the second wiring layer 220*a* shown in FIGS. 1B, 2B, 3B, 4B, and 5B instead of the second semiconductor chip 200 including the second wiring layer 220.

Figure 7A:
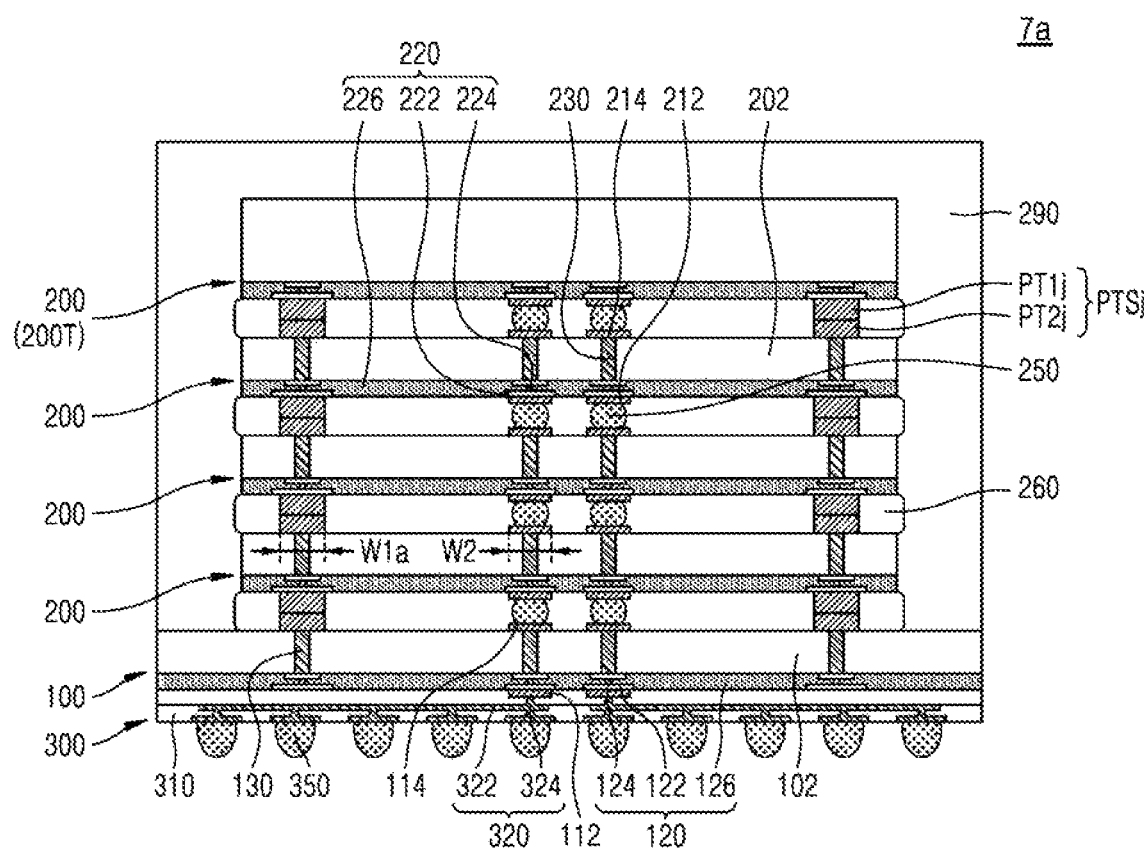

Referring to FIG. 7A, a semiconductor package 7*a* may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSj may be between the first semiconductor chip 100 and the plurality of second semiconductor chips 200. Each of the plurality of support structures PTSj may include a first support post PT1*j* attached to a second wiring layer 220 and a second support post PT2*j* that is attached to an inactive surface of a first or second substrate 102 or 202 and contacts the first support post PT1*j*.

The first and second support posts PT1*j* and PT2*j* may each have a first horizontal width W1*a* that is substantially equal to a second horizontal width W2. In an implementation, the first horizontal width W1*a* may be about 20 µm to about 60 µm.

Figure 7B:
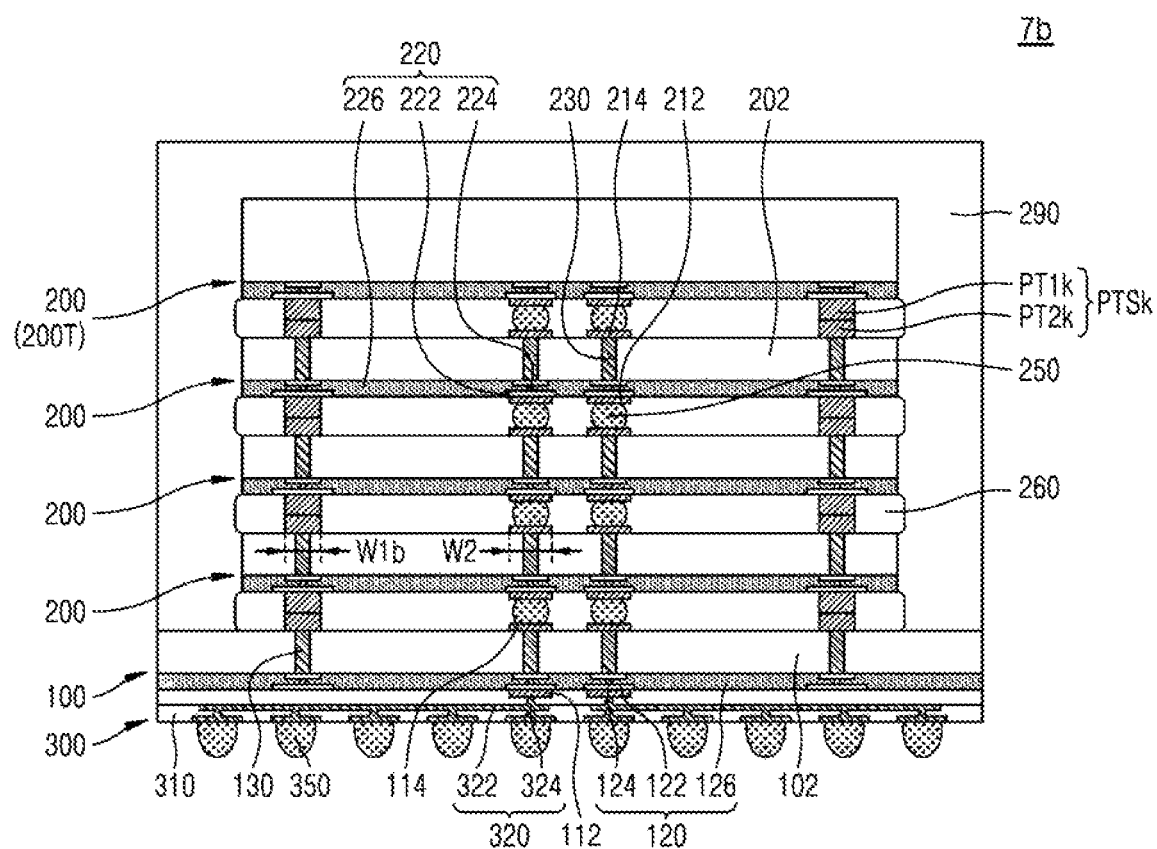

Referring to FIG. 7B, a semiconductor package 7*b* may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTSk may be between the first semiconductor chip 100 and the plurality of second semiconductor chips 200. Each of the plurality of support structures PTSk may include a first support post PT1*k* attached to a second wiring layer 220 and a second support post PT2*k* that is attached to an inactive surface of a first or second substrate 102 or 202 and contacts the first support post PT1*k*.

The first and second support posts PT1*k* and PT2*k* may each have a first horizontal width W1*b* that is less than a second horizontal width W2. In an implementation, the first horizontal width W1*b* may be about 10 µm to about 55 µm.

A horizontal width of each of the support structures PTSa, PTSb, PTSc, PTSd, PTSe, PTSf, PTSg, PTSh, and PTSi respectively included in the semiconductor packages 2*a* and 2*b*, 3*a* and 3*b*, 4*a* and 4*b*, 5*a* and 5*b*, 6*a*, 6*b*, 6*c*, 6*d*, and 6*e* of FIGS. 2A through 6E may be one of the first horizontal width W1 that is the horizontal width of the support structure PTS shown in FIG. 1A, the first horizontal width W1*a* that is the horizontal width of the support structure PTSj shown in FIG. 7A, and the first horizontal width W1*b* that is the horizontal width of the support structure PTSk shown in FIG. 7B.

Figure 8:
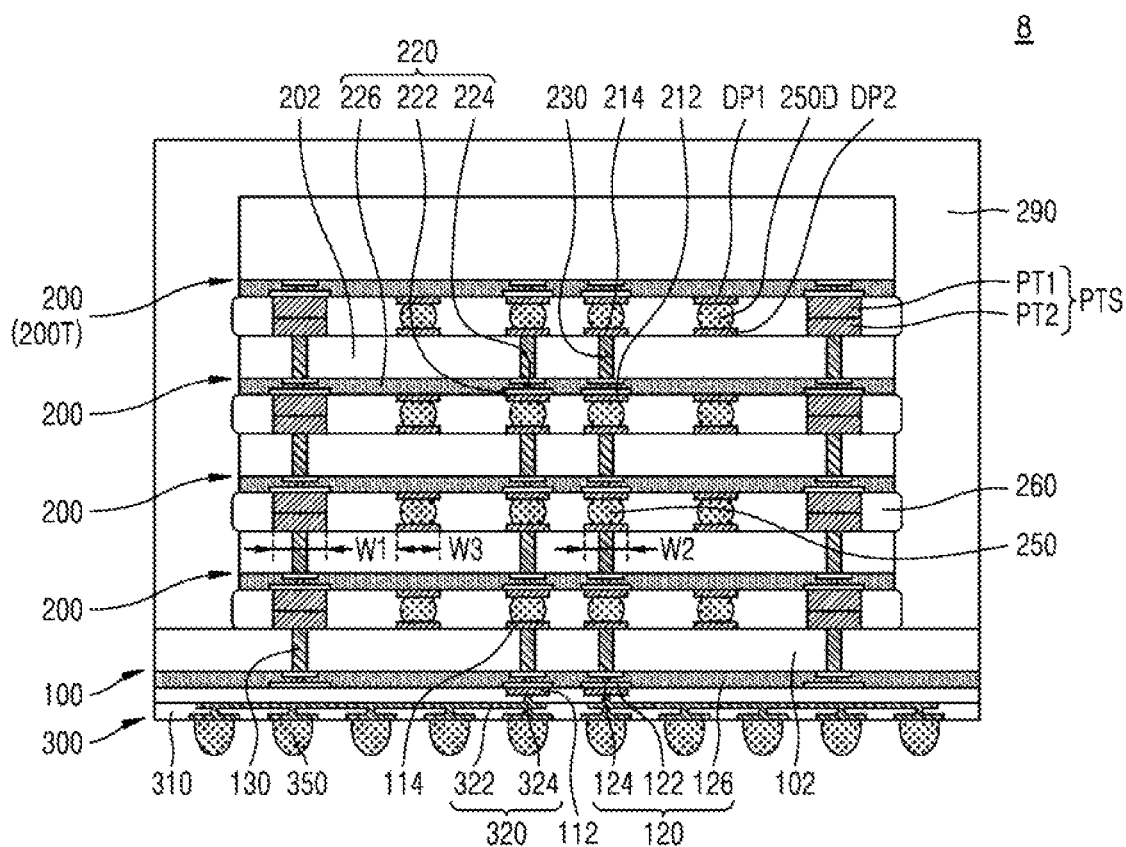

FIG. 8 is a cross-sectional view of a semiconductor package 8 according to example embodiments.

Referring to FIG. 8, the semiconductor package 8 may include an interposer 300, a first semiconductor chip 100 mounted on the interposer 300, a plurality of second semiconductor chips 200 stacked on the first semiconductor chip 100, and insulating adhesive layers 260 between the first semiconductor chip 100 and the plurality of second semiconductor chips 200.

A plurality of support structures PTS may be interposed between the first semiconductor chip 100 and the plurality of second semiconductor chips 200. Each of the plurality of support structures PTS may include a first support post PT1 attached to a second wiring layer 220 and a second support post PT2 that is attached to an inactive surface of a first or second substrate 102 or 202 and contacts the first support post PT1.

The semiconductor package 8 may further include a plurality of front dummy pads DP1 attached to the lower surface of the first or second semiconductor chip 100 or 200, i.e., the second wiring layer 220, a plurality of rear dummy pads DP2 attached to an upper surface of the first or second semiconductor chip 100 or 200, i.e., the inactive surface of the first or second substrate 102 or 202, and a plurality of dummy connection terminals 250D between the plurality of front dummy pads DP1 and the plurality of rear dummy pads DP2.

Because the plurality of front dummy pads DP1 are substantially the same as a plurality of first front connection pads 112 or a plurality of second front connection pads 212, the plurality of rear dummy pads DP2 are substantially the same as a plurality of second rear connection pads 214, and the plurality of dummy connection terminals 250D are substantially the same as a plurality of chip connection terminals 250, redundant or repeated descriptions thereof may be omitted below.

In an implementation, the plurality of front dummy pads DP1 may not contact second wiring patterns 222 of the second wiring layer 220, and may contact the second inter-wiring insulating layer 226. In an implementation, the plurality of rear dummy pads DP2 may not contact the first or second through electrodes 130 or 230, and may contact the inactive surface of the first or second substrate 102 or 202.

The first and second support posts PT1 and PT2 may each have a first horizontal width W1. In an implementation, each of the second front connection pad 212, the first rear connection pad 114, and the second rear connection pad 214 may have a second horizontal width W2. In an implementation, the front dummy pad DP1 and the rear dummy pad DP2 may each have a third horizontal width W3. In an implementation, the second horizontal width W2 may be substantially equal to the third horizontal width W3.

In an implementation, the semiconductor package 8 may include, instead of the support structure PTS, any one of the support structures PTSa, PTSb, PTSc, PTSd, PTSe, PTSf, PTSg, PTSh, and PTSi included in the semiconductor package 2a, 2b, 3a, 3b, 4a, 4b, 5a, 5b, 6a, 6b, 6c, 6d, and 6e shown in FIGS. 2A through 6E, and the support structure PTS may have, instead of the first horizontal width W1, the first horizontal width W1a that is the horizontal width of the support structure PTSj shown in FIG. 7A, or the first horizontal width W1b that is the horizontal width of the support structure PTSk shown in FIG. 7B.

Figure 9A:
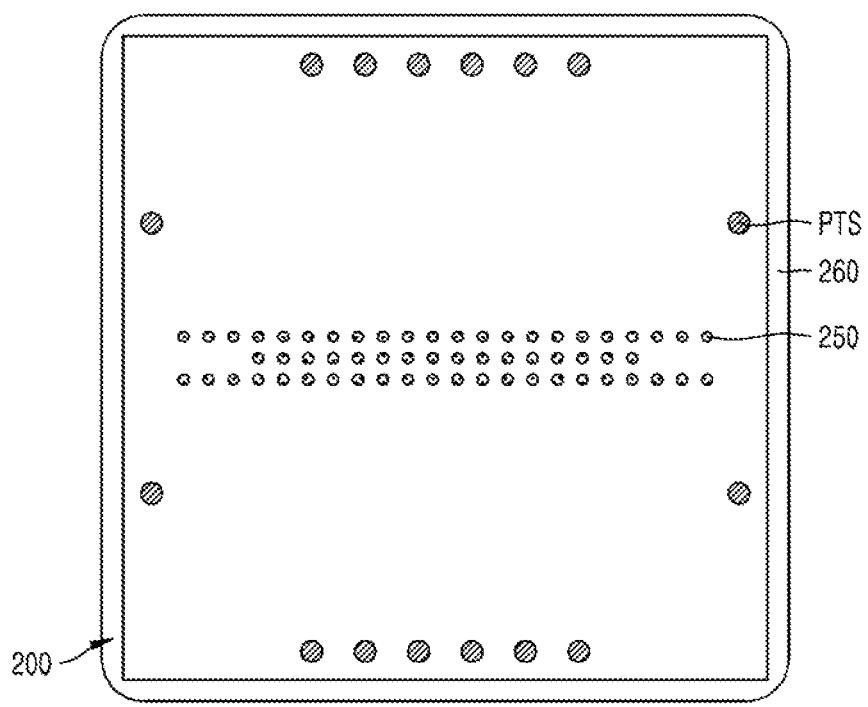
FIGS. 9A through 9C are planar layouts of planar arrangements of some components of semiconductor packages, according to example embodiments.
Figure 9B:
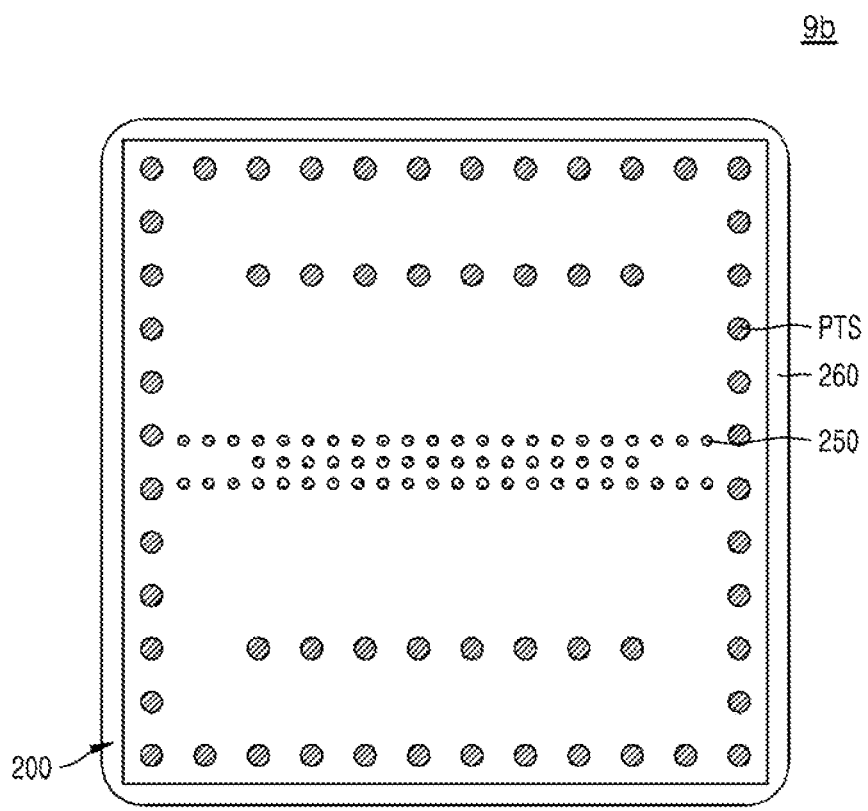
Figure 9C:
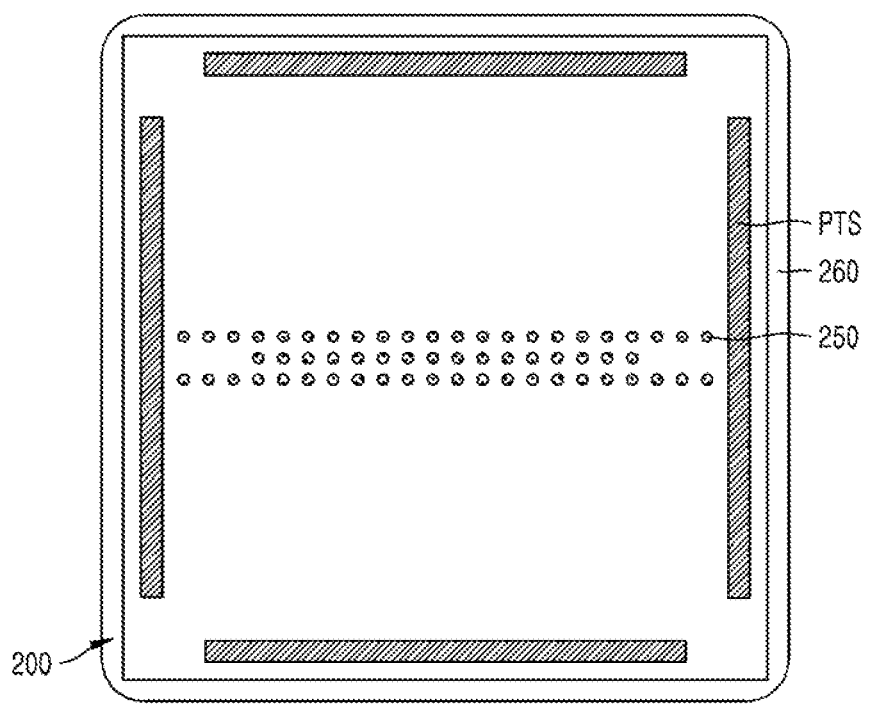

FIGS. 9A through 9C are planar layouts respectively illustrating planar arrangements of some components of semiconductor packages 9a, 9b, and 9c, according to example embodiments.

Referring to FIG. 9A, a plurality of chip connection terminals 250 included in the semiconductor package 9a may be arranged in a planar fashion near a center of a second semiconductor chip 200. In an implementation, the first front connection pads 112, the first rear connection pads 114, the second front connection pads 212, and the second rear connection pads 214 shown in FIGS. 1A through 8 may be center pads. A plurality of support structures PTS included in the semiconductor package 9a may be arranged in a planar fashion along or near edges of the second semiconductor chip 200. An insulating adhesive layer 260 may have a fillet convexly protruding outwardly from or beyond the edges of the second semiconductor chip 200.

Referring to FIG. 9B, a plurality of chip connection terminals 250 included in the semiconductor package 9b may be arranged in a planar fashion near a center of a second semiconductor chip 200. In an implementation, the first front connection pads 112, the first rear connection pads 114, the second front connection pads 212, and the second rear connection pads 214 shown in FIGS. 1A through 8 may be center pads. Some of a plurality of support structures PTS included in the semiconductor package 9b may be arranged in a planar fashion along or near edges of the second semiconductor chip 200, and other ones thereof may be arranged in a planar fashion within the second semiconductor chip 200 between the edges of the second semiconductor chip 200 and the plurality of chip connection terminals 250.

Referring to FIG. 9C, a plurality of chip connection terminals 250 included in the semiconductor package 9c may be arranged in a planar fashion near a center of a second semiconductor chip 200. In an implementation, the first front connection pads 112, the first rear connection pads 114, the second front connection pads 212, and the second rear connection pads 214 shown in FIGS. 1A through 8 may be center pads. A plurality of support structures PTS in the semiconductor package 9c may have a horizontal (e.g., elongated) shape that is a bar shape and extend along or near edges of the second semiconductor chip 200.

The planar arrangements of the plurality of chip connection terminals 250 and the plurality of support structures PTS included in the semiconductor packages 9a, 9b, and 9c as illustrated in FIGS. 9A through 9C may be planar arrangements of the plurality of chip connection terminals 250 and the plurality of support structures PTS, PTSa, PTSb, PTSc, PTSd, PTSe, PTSf, PTSg, PTSh, PTSi, PTSj, and PTSk in semiconductor packages 1a, 1b, 2a, 2b, 3a, 3b, 4a, 4b, 5a, 5b, 6a, 6b, 6c, 6d, 6e, 7a, and 7b as illustrated in FIGS. 1A through 8.

Figure 10A:
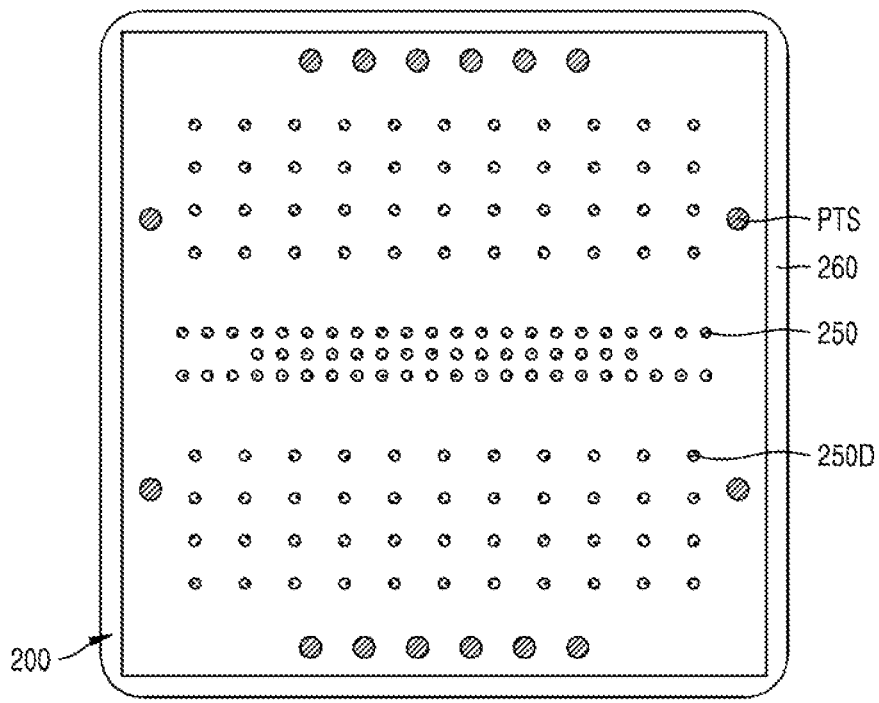
FIGS. 10A through 10C are planar layouts of planar arrangements of some components of semiconductor packages, according to example embodiments.
Figure 10B:
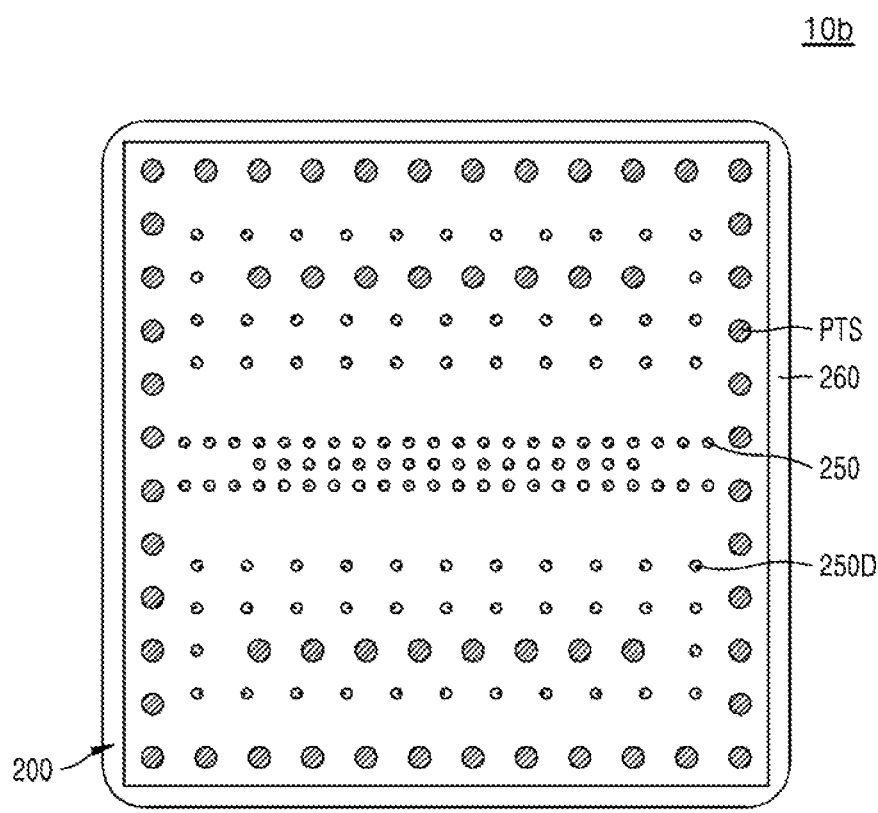
Figure 10C:
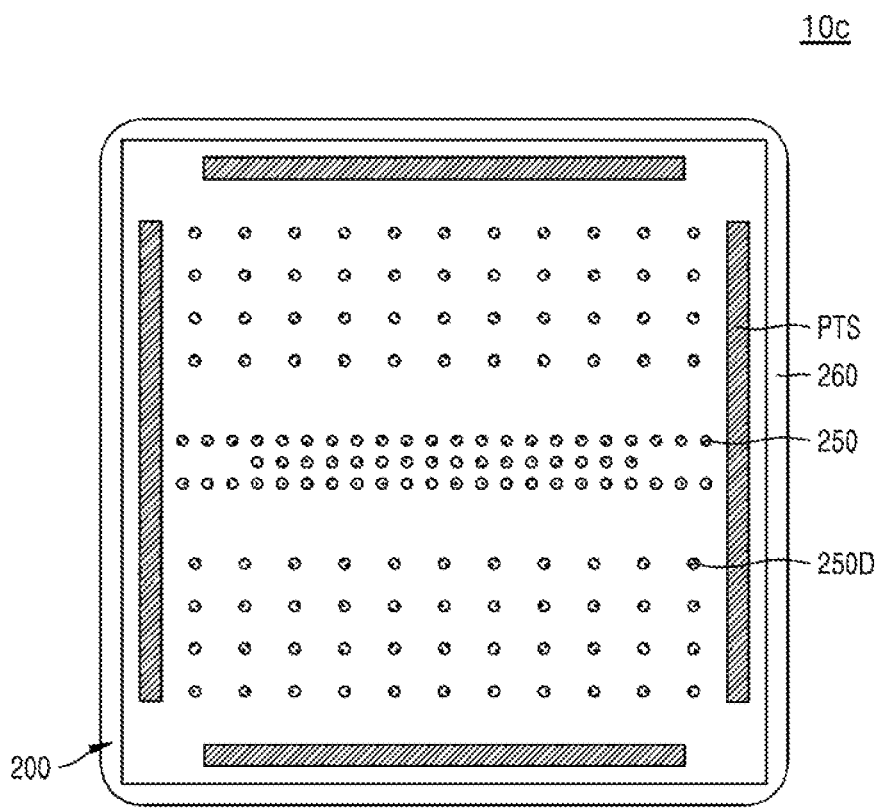

FIGS. 10A through 10C are planar layouts respectively illustrating planar arrangements of some components of semiconductor packages 10a, 10b, and 10c, according to example embodiments.

Referring to FIG. 10A, a plurality of chip connection terminals 250 included in the semiconductor package 10a may be arranged in a planar fashion near a center of a second semiconductor chip 200. A plurality of support structures PTS included in the semiconductor package 10a may be arranged in a planar fashion along or near edges of the second semiconductor chip 200. A plurality of dummy connection terminals 250D in the semiconductor package 10a may be arranged in a planar fashion within the second semiconductor chip 200 between the edges of the second semiconductor chip 200 and the plurality of chip connection terminals 250.

Referring to FIG. 10B, a plurality of chip connection terminals 250 included in the semiconductor package 10a may be arranged in a planar fashion near a center of a second semiconductor chip 200. Some of a plurality of support structures PTS included in the semiconductor package 10b may be arranged in a planar fashion along or near edges of the second semiconductor chip 200, and other ones thereof may be arranged in a planar fashion within the second semiconductor chip 200 between the edges of the second semiconductor chip 200 and the plurality of chip connection terminals 250. A plurality of dummy connection terminals 250D included in the semiconductor package 10b may be spaced apart from the plurality of support structures PTS in a planar fashion between edges of the second semiconductor chip 200 and the plurality of chip connection terminals 250, and may be arranged within the second semiconductor chip 200.

Referring to FIG. 10C, a plurality of chip connection terminals 250 included in the semiconductor package 10c may be arranged in a planar fashion near a center of a second semiconductor chip 200. A plurality of support structures PTS in the semiconductor package 10c may have a horizontal shape that is a bar shape and extend along or near edges of the second semiconductor chip 200. A plurality of dummy connection terminals 250D in the semiconductor package 10c may be arranged in a planar fashion within the second semiconductor chip 200 between the edges of the second semiconductor chip 200 and the plurality of chip connection terminals 250.

The planar arrangements of the plurality of chip connection terminals 250 and the plurality of support structures PTS included in the semiconductor packages 10a, 10b, and 10c as illustrated in FIGS. 10A through 10C may be a planar arrangement of the plurality of chip connection terminals 250 and the plurality of support structures PTS in the semiconductor package 8 of FIG. 8.

By way of summation and review, in order to reduce the size of a semiconductor package including a plurality of semiconductor chips, semiconductor packages with a plurality of semiconductor chips vertically stacked therein have been developed.

One or more embodiments may provide a semiconductor package including a plurality of vertically stacked semiconductor chips.

One or more embodiments may provide a semiconductor package exhibiting structural reliability and including a plurality of vertically stacked semiconductor chips.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a first semiconductor chip;
   second semiconductor chips sequentially stacked on the first semiconductor chip;
   for each second semiconductor chip, a front connection pad on a lower surface of the second semiconductor chip;
   for each semiconductor chip of the first semiconductor chip and the second semiconductor chips, a rear connection pad attached to an upper surface of the semiconductor chip, wherein each rear connection pad faces a corresponding front connection pad;
   for each rear connection pad and corresponding front connection pad, a chip connection terminal between the front connection pad and the rear connection pad; and
   a support structure between the first semiconductor chip and one of the second semiconductor chips, and support structures between adjacent ones of the second semiconductor chips, each support structure:
      being spaced apart from the front connection pads, the rear connection pads, and the chip connection terminals,
      having a vertical height greater than a vertical height of the chip connection terminals, and
      including a metal,
   wherein the support structures are electrically isolated from active circuitry in the first semiconductor chip and the second semiconductor chips,
   wherein each support structure includes:
      a first support post attached to the lower surface of the corresponding second semiconductor chip, and
      a second support post attached to the upper surface of the first semiconductor chip or to the upper surface of a corresponding one of the second semiconductor chips, the upper surface of each second semiconductor chip being opposite to the lower surface of said second semiconductor chip, and
   wherein a lower surface of each first support post contacts an upper surface of the corresponding second support post.

2. The semiconductor package as claimed in claim 1, wherein, for each support structure, the first support post of the support structure has a thickness substantially equal to a thickness of the second support post of the support structure.

3. The semiconductor package as claimed in claim 1, wherein, for each support structure:
   the second support post has a thickness greater than a thickness of the first support post, and
   the first support post has a thickness substantially equal to the thickness of each of the front connection pads.

4. The semiconductor package as claimed in claim 1, wherein, for each support structure:
   the first support post has a thickness greater than a thickness of the second support post, and
   the second support post has a thickness substantially equal to the thickness of each of the rear connection pads.

5. The semiconductor package as claimed in claim 1, wherein the support structure further includes a buffer layer between a lower surface of the first support post and an upper surface of the second support post, the buffer layer being formed of an organic material.

6. The semiconductor package as claimed in claim 5, wherein a thickness of the buffer layer is less than the vertical height of the chip connection terminal.

7. The semiconductor package as claimed in claim 1, wherein:
   the first semiconductor chip includes a first substrate and a first wiring layer on a lower surface of the first substrate, the lower surface being an active surface of the first semiconductor chip,
   for each second semiconductor chip of the second semiconductor chips, the second semiconductor chip includes a second substrate and a second wiring layer on a lower surface of the second substrate, the lower surface being an active surface of the second semiconductor chip and including a wiring pattern, a wiring via connected to the wiring pattern, and an inter-wiring insulating layer surrounding the wiring pattern and the wiring via, and
   the corresponding front connection pad and the corresponding support structure contact the wiring pattern.

8. The semiconductor package as claimed in claim 1, further comprising:
   for each second semiconductor chip of the second semiconductor chips, the second semiconductor chip includes a front dummy pad on the lower surface of the second semiconductor chip, the front dummy pad being spaced apart from the front connection pad and the support structure;
   for each semiconductor chip of the first semiconductor chip and the second semiconductor chips, a rear dummy pad attached to the upper surface of the semiconductor chip, the rear dummy pad being spaced apart from the corresponding rear connection pad and the corresponding support structure; and for each front dummy pad and corresponding rear dummy pad, a dummy connection terminal between the front dummy pad and the rear dummy pad, wherein, for each support structure, the support structure has a horizontal width that is greater than horizontal widths of each of the front connection pads, the front dummy pads, the rear connection pads, and the rear dummy pads.

9. A semiconductor package, comprising:

an interposer;

a first semiconductor chip mounted on the interposer;

second semiconductor chips sequentially stacked on the first semiconductor chip;

for each second semiconductor chip, a front connection pad on a lower surface of the second semiconductor chip;

for each semiconductor chip of the first semiconductor chip and the second semiconductor chips, a rear connection pad attached to an upper surface of the semiconductor chip;

for each rear connection pad and corresponding front connection pad, a chip connection terminal between the front connection pad and the rear connection pad;

a support structure between the first semiconductor chip and one of the second semiconductor chips, and support structures between adjacent ones of the second semiconductor chips, each support structure being formed of a metal and including:

a first support post attached to the lower surface of the corresponding second semiconductor chip, and a second support post attached to the upper surface of the first semiconductor chip or to the upper surface of a corresponding one of the second semiconductor chips, the upper surface of each second semiconductor chip being opposite to the lower surface of said second semiconductor chip;

an insulating adhesive layer between the first semiconductor chip and one of the second semiconductor chips, and insulating adhesive layers between adjacent ones of the second semiconductor chips, each insulating adhesive layer:

surrounding the corresponding chip connection terminal and the corresponding support structure, and having a thickness substantially equal to a thickness of the corresponding support structure; and a molding layer on the first semiconductor chip and surrounding the second semiconductor chips and the insulating adhesive layers, wherein each support structure is electrically isolated from active circuitry in the first semiconductor chip and the second semiconductor chips, and wherein, for each support structure, a lower surface of the first support post contacts an upper surface of the second support post.

10. The semiconductor package as claimed in claim 9, wherein, for each support structure, the first support post and the second support post each have a thickness equal to one half of the thickness of the corresponding insulating adhesive layer.

11. The semiconductor package as claimed in claim 9, wherein:

the first semiconductor chip has a horizontal width and an area that are greater than a horizontal width and an area of each of the second semiconductor chips, and edges of the interposer, edges of the first semiconductor chip, and edges of the molding layer are aligned with one another in a vertical direction.

12. The semiconductor package as claimed in claim 9, wherein, for each support structure, a horizontal width of each of the first support post and the second support post is greater than a horizontal width of the corresponding front connection pad and a horizontal width of the corresponding rear connection pad.

13. The semiconductor package as claimed in claim 9, wherein:

for each second semiconductor chip, the chip connection terminal and the rear connection pad are each arranged in a planar fashion adjacent to a center of the second semiconductor chip, and for each support structure, the support structure is arranged in a planar fashion adjacent to edges of each of the corresponding second semiconductor chips.

14. The semiconductor package as claimed in claim 9, wherein each insulating adhesive layer has a fillet that partially protrudes outwardly from a space between corresponding semiconductor chips of the first semiconductor chip and the second semiconductor chips.

15. The semiconductor package as claimed in claim 9, wherein, for each support structure, the first support post of the support structure and the second support post of the support structure each have a cylindrical shape.

16. A semiconductor package, comprising:

a redistribution layer (RDL) interposer;

a buffer chip including a first substrate, first through electrodes penetrating at least a portion of the first substrate, and a first wiring layer on an active surface of the first substrate and including first wiring patterns, first wiring vias, and a first inter-wiring insulating layer surrounding the first wiring patterns and the first wiring vias, the buffer chip being attached to the RDL interposer with the active surface of the first substrate facing the RDL interposer;

memory cell chips, each of which includes a second substrate, second through electrodes penetrating at least a portion of the second substrate, and a second wiring layer on an active surface of the second substrate and including second wiring patterns, second wiring vias, and a second inter-wiring insulating layer surrounding the second wiring patterns and the second wiring vias, each memory cell chip being sequentially stacked on the buffer chip with the active surface of the second substrate of each memory chip facing the buffer chip;

for each memory cell chip, front connection pads attached to a lower surface of the second wiring layer;

for each substrate of the first substrate and the second substrates, rear connection pads attached to an inactive surface of the substrate;

for each rear connection pad and corresponding front connection pad, a chip connection terminal between the corresponding front connection pad and the rear connection pad;

a support structure between the buffer chip and one of the memory cell chips, and support structures between adjacent ones of the memory cell chips, each support structure being formed of a metal and including a first support post spaced apart from a corresponding front connection pad and contacting corresponding second wiring patterns, and a second support post spaced apart from a corresponding rear connection pad and contacting some of the corresponding second through electrodes;

an insulating adhesive layer between the buffer chip and one of the memory cell chips, and insulating adhesive layers between adjacent ones of the memory cell chips, each insulating layer surrounding corresponding chip connection terminals and corresponding support structures, each insulating adhesive layer having a thickness substantially equal to a thickness of each of the support structures; and a molding layer on the buffer chip and surrounding the memory cell chips and the insulating adhesive layers, wherein the support structures are electrically isolated from active circuitry in the buffer chip and the memory cell chips, wherein, for each support structure, a lower surface of the first support post of the support structure contacts an upper surface of the second support post of the support structure.

17. The semiconductor package as claimed in claim 16, wherein, for each support structure:
a thickness of each of the first support post and the second support post is about 3 μm to about 10 μm, and
a horizontal width of the first support post and a horizontal width of the second support post are each greater than a horizontal width of each of the front connection pads and a horizontal width of each of the rear connection pads.

18. The semiconductor package as claimed in claim 16, wherein, for each support structure, the first support post and the second support post each include copper and each have a cylindrical shape.

* * * * *